(12) United States Patent
O'Rourke et al.

(10) Patent No.: US 8,999,778 B2
(45) Date of Patent: Apr. 7, 2015

(54) METHOD OF PROVIDING A FLEXIBLE SEMICONDUCTOR DEVICE AT HIGH TEMPERATURES AND FLEXIBLE SEMICONDUCTOR DEVICE THEREOF

(75) Inventors: Shawn O'Rourke, Tempe, AZ (US); Curtis Moyer, Phoenix, AZ (US); Scott Ageno, Phoenix, AZ (US); Dirk Bottesch, Mesa, AZ (US); Barry O'Brien, Chandler, AZ (US); Michael Marrs, Phoenix, AZ (US)

(73) Assignee: Arizona Board of Regents, Scottsdale, AZ (US)

( * ) Notice: Subject to any disclaimer, the term of this patent is extended or adjusted under 35 U.S.C. 154(b) by 18 days.

(21) Appl. No.: 13/298,451

(22) Filed: Nov. 17, 2011

(65) Prior Publication Data
US 2012/0061672 A1    Mar. 15, 2012

Related U.S. Application Data

(63) Continuation of application No. PCT/US2010/036569, filed on May 28, 2010, and a continuation-in-part of application No. PCT/US2009/066114, filed on Nov. 30, 2009, said (Continued)

(51) Int. Cl.
| | |
|---|---|
| *H01L 21/84* | (2006.01) |
| *H01L 21/683* | (2006.01) |
| *H01L 29/66* | (2006.01) |
| *H01L 29/786* | (2006.01) |

(52) U.S. Cl.
CPC ...... *H01L 21/6835* (2013.01); *H01L 29/66765* (2013.01); *H01L 29/78603* (2013.01); *H01L 2221/6835* (2013.01); *H01L 2924/3025* (2013.01)

(58) Field of Classification Search
USPC ............ 438/149, 151, 158, 159, 161; 257/57, 257/59, 60, 72
See application file for complete search history.

(56) References Cited

U.S. PATENT DOCUMENTS

| | | |
|---|---|---|
| 3,089,801 A | 5/1963 | Tierney et al. |
| 3,684,637 A | 8/1972 | Andersen et al. |
| 3,723,635 A | 3/1973 | Smith |

(Continued)

FOREIGN PATENT DOCUMENTS

| | | |
|---|---|---|
| CN | 1118075 | 3/1996 |
| CN | 101231972 | 7/2007 |

(Continued)

OTHER PUBLICATIONS

International Search Report and Written Opinion for PCT Application No. PCT/US2011/037226, 11 pages, Feb. 21, 2012.

(Continued)

*Primary Examiner* — Fernando L Toledo
*Assistant Examiner* — Bryan Junge
(74) *Attorney, Agent, or Firm* — Bryan Cave LLP

(57) ABSTRACT

Some embodiments include a method of providing a semiconductor device. The method can include: (a) providing a flexible substrate; (b) depositing at least one layer of material over the flexible substrate, wherein the deposition of the at least one layer of material over the flexible substrate occurs at a temperature of at least 180° C.; and (c) providing a diffusion barrier between a metal layer and an a-Si layer. Other embodiments are disclosed in this application.

20 Claims, 24 Drawing Sheets

Related U.S. Application Data application No. PCT/US2010/036569 is a continuation-in-part of application No. PCT/US2009/066111, filed on Nov. 30, 2009, said application No. PCT/US2010/036569 is a continuation-in-part of application No. PCT/US2009/066259, filed on Dec. 1, 2009.

(60) Provisional application No. 61/182,464, filed on May 29, 2009, provisional application No. 61/230,051, filed on Jul. 30, 2009, provisional application No. 61/119,303, filed on Dec. 2, 2008, provisional application No. 61/119,248, filed on Dec. 2, 2008, provisional application No. 61/119,217, filed on Dec. 2, 2008.

(56) References Cited

U.S. PATENT DOCUMENTS

| | | |
|---|---|---|
| 4,337,107 A | 6/1982 | Eshleman |
| 4,349,593 A | 9/1982 | Blechstein |
| 4,858,073 A | 8/1989 | Gregory |
| 5,098,772 A | 3/1992 | AF Strom |
| 5,220,488 A | 6/1993 | Denes |
| 5,229,882 A | 7/1993 | Rowland |
| 5,252,383 A | 10/1993 | Fukutake et al. |
| 5,264,063 A | 11/1993 | Martin |
| 5,292,686 A | 3/1994 | Riley et al. |
| 5,453,157 A | 9/1995 | Jeng |
| 5,702,980 A | 12/1997 | Yu et al. |
| 5,714,305 A | 2/1998 | Teng et al. |
| 5,853,511 A | 12/1998 | Fairbanks |
| 5,861,470 A | 1/1999 | Voss et al. |
| 5,869,150 A | 2/1999 | Iwamoto |
| 5,890,429 A | 4/1999 | Alam et al. |
| 5,916,652 A | 6/1999 | Miner et al. |
| 6,051,169 A | 4/2000 | Brown et al. |
| 6,051,508 A | 4/2000 | Takase et al. |
| 6,083,580 A | 7/2000 | Finestone et al. |
| 6,177,163 B1 | 1/2001 | Blok et al. |
| 6,358,832 B1 | 3/2002 | Edelstein et al. |
| 6,482,288 B1 | 11/2002 | Kreckel et al. |
| 6,531,389 B1 | 3/2003 | Shue et al. |
| 6,541,398 B2 | 4/2003 | Grill et al. |
| 6,627,037 B1 | 9/2003 | Kurokawa et al. |
| 6,630,289 B1 | 10/2003 | Kwok et al. |
| 6,632,746 B2 | 10/2003 | Kanegae et al. |
| 6,670,265 B2 | 12/2003 | Wang et al. |
| 6,746,969 B2 | 6/2004 | Shimada et al. |
| 6,752,160 B2* | 6/2004 | Chen .................. 134/104.1 |
| 6,808,773 B2 | 10/2004 | Shimamura et al. |
| 6,825,068 B2 | 11/2004 | Denis et al. |
| 7,212,088 B1 | 5/2007 | Norregaard et al. |
| 7,316,942 B2 | 1/2008 | Sarma et al. |
| 7,329,601 B2 | 2/2008 | Miyajima |
| 7,344,993 B2 | 3/2008 | Balasubramaniam et al. |
| 7,385,224 B2* | 6/2008 | Ishii et al. ................ 257/72 |
| 7,481,901 B2 | 1/2009 | Toyoda et al. |
| 7,538,038 B2 | 5/2009 | Matsushita et al. |
| 7,795,006 B2 | 9/2010 | Nagino et al. |
| 7,838,328 B2 | 11/2010 | Isa |
| 7,906,193 B2 | 3/2011 | Yukawa et al. |
| 8,038,820 B2* | 10/2011 | Kim et al. ................ 156/230 |
| 8,048,251 B2 | 11/2011 | Yamashita et al. |
| 2002/0008839 A1 | 1/2002 | Miyai et al. |
| 2002/0018173 A1 | 2/2002 | Furukawa et al. |
| 2002/0081863 A1 | 6/2002 | Shimada et al. |
| 2003/0072889 A1 | 4/2003 | Abrams |
| 2003/0201465 A1 | 10/2003 | Ryuzaki et al. |
| 2004/0008298 A1 | 1/2004 | Kwok et al. |
| 2004/0110326 A1 | 6/2004 | Forbes et al. |
| 2005/0186801 A1 | 8/2005 | Uno et al. |
| 2005/0221542 A1* | 10/2005 | Yamazaki et al. ........... 438/149 |
| 2005/0221599 A1 | 10/2005 | Kanegae et al. |
| 2005/0233583 A1 | 10/2005 | Miyajima |
| 2005/0242341 A1 | 11/2005 | Knudson et al. |
| 2006/0017154 A1 | 1/2006 | Eguchi et al. |
| 2006/0019491 A1 | 1/2006 | Soda |
| 2006/0148141 A1* | 7/2006 | Seo et al. ................ 438/151 |
| 2006/0169485 A1 | 8/2006 | Kawaguchi et al. |
| 2006/0180815 A1 | 8/2006 | Sarma et al. |
| 2006/0192229 A1* | 8/2006 | Kato et al. ................ 257/207 |
| 2006/0194363 A1* | 8/2006 | Giesberg et al. ............. 438/99 |
| 2006/0223282 A1 | 10/2006 | Amundson et al. |
| 2007/0241436 A1 | 10/2007 | Ookubo et al. |
| 2008/0038885 A1* | 2/2008 | Lee et al. ................ 438/166 |
| 2008/0050548 A1 | 2/2008 | Abrams |
| 2008/0090338 A1 | 4/2008 | Tredwell et al. |
| 2008/0105877 A1 | 5/2008 | Yamazaki et al. |
| 2008/0122121 A1 | 5/2008 | Suda et al. |
| 2008/0179594 A1 | 7/2008 | Oh |
| 2009/0004419 A1 | 1/2009 | Cok et al. |
| 2009/0008132 A1 | 1/2009 | Takasawa et al. |
| 2009/0101903 A1 | 4/2009 | Chen et al. |
| 2009/0202857 A1* | 8/2009 | Kerr et al. ................ 428/615 |
| 2009/0211791 A1 | 8/2009 | Tredwell et al. |
| 2009/0229874 A1 | 9/2009 | Katagiri et al. |
| 2009/0296754 A1 | 12/2009 | Ledentsov et al. |
| 2010/0003512 A1 | 1/2010 | Ookubo et al. |
| 2010/0003513 A1 | 1/2010 | Ookubo et al. |
| 2010/0038023 A1 | 2/2010 | Kho et al. |
| 2010/0059171 A1 | 3/2010 | Chun et al. |
| 2010/0059747 A1 | 3/2010 | Nakayama et al. |
| 2010/0140807 A1 | 6/2010 | Kobayashi et al. |
| 2010/0155694 A1 | 6/2010 | Miller et al. |
| 2010/0219410 A1 | 9/2010 | Godo et al. |
| 2010/0295161 A1 | 11/2010 | Koduri |
| 2010/0330748 A1 | 12/2010 | Chu et al. |
| 2011/0064953 A1 | 3/2011 | O'Rourke et al. |
| 2012/0061672 A1 | 3/2012 | O'Rourke et al. |
| 2012/0146713 A1 | 6/2012 | Kim et al. |
| 2012/0168836 A1 | 7/2012 | Lee et al. |

FOREIGN PATENT DOCUMENTS

| | | |
|---|---|---|
| CN | 101288348 | 10/2008 |
| JP | 01-198094 | 9/1989 |
| JP | 07-022795 | 1/1995 |
| JP | 08-148814 | 7/1996 |
| JP | 11-340462 | 10/1999 |
| JP | 2004-311912 | 11/2004 |
| JP | 2005-123576 | 12/2005 |
| JP | 2007-073559 | 3/2007 |
| JP | 2007-123861 | 5/2007 |
| JP | 2007146121 | 6/2007 |
| JP | 2009-71057 | 4/2009 |
| JP | 2010-067849 | 3/2010 |
| JP | 2010-226101 | 10/2010 |
| KR | 20070103050 A | 10/2007 |
| KR | 100810708 B1 | 3/2008 |
| KR | 10-2009-0098033 | 9/2009 |
| KR | 10-2010-0007703 | 1/2010 |
| KR | 10-2010-0043654 | 4/2010 |
| WO | WO9852391 A1 | 11/1998 |
| WO | 2006088564 A1 | 8/2006 |
| WO | 2007083906 | 7/2007 |
| WO | WO2007108659 A1 | 9/2007 |
| WO | WO2008005979 A1 | 1/2008 |
| WO | WO2010051106 A2 | 5/2010 |
| WO | 2010-065542 | 6/2010 |

OTHER PUBLICATIONS

International Search Report and Written Opinion for PCT Application No. PCT/US2011/037207, 11 pages, Feb. 21, 2012.

International Search Report and Written Opinion from corresponding Int'l Application No. PCT/US10/036569 dated Dec. 27, 2010.

International Search Report and Written Opinion from related Int'l Application No. PCT/US09/066114 dated Sep. 3, 2010.

International Search Report and Written Opinion from related Int'l Application No. PCT/US09/066111 dated Oct. 25, 2010.

(56) References Cited

OTHER PUBLICATIONS

International Search Report and Written Opinion from related Int'l Application No. PCT/US09/066259 dated May 5, 2010.

International Preliminary Report on Patentability from corresponding Int'l Application No. PCT/US10/036569 dated Dec. 8, 2011.

International Preliminary Report on Patentability from related Int'l Application No. PCT/US09/066114 dated Jun. 16, 2011.

International Preliminary Report on Patentability from related Int'l Application No PCT/US09/066111 dated Jun. 16, 2011.

International Preliminary Report on Patentability from related Int'l Application No. PCT/US09/066259 dated Jun. 16, 2011.

International Search Report and Written Opinion for PCT/US2013/058284, dated Dec. 26, 2013.

International Search Report and Written Opinion for PCT/US2013/058293, dated Dec. 26, 2013.

International Search and Written Opinion Report for PCT/US2012/066833, dated Jan. 17, 2013.

\* cited by examiner

METHOD OF PROVIDING A FLEXIBLE SEMICONDUCTOR DEVICE AT HIGH TEMPERATURES AND FLEXIBLE SEMICONDUCTOR DEVICE THEREOF

CLAIM OF PRIORITY

This application is a continuation of PCT Application No. PCT/US2010/036569, filed May 28, 2010. PCT Application No. PCT/US2010/036569 claims the benefit of U.S. Provisional Application No. 61/182,464, filed May 29, 2009 and U.S. Provisional Application No. 61/230,051, filed Jul. 30, 2009. Meanwhile, PCT Application No. PCT/US2010/036569 is a continuation-in-part application of PCT Application No PCT/US2009/066114, filed Nov. 30, 2009, which claims priority to U.S. Provisional Application No. 61/119,303, filed Dec. 2, 2008. PCT Application No. PCT/US2010/036569 is also continuation-in-part application of PCT Application No PCT/US2009/066111, filed Nov. 30, 2009, which claims priority to U.S. Provisional Application No. 61/119,248, filed Dec. 2, 2008. Furthermore, PCT Application No. PCT/US2010/036569 is a also continuation-in-part application of PCT Application No PCT/US2009/066259, filed Dec. 1, 2009, which claims priority to (a) U.S. Provisional Application No. 61/119,217, filed Dec. 2, 2008, (b) U.S. Provisional Application No. 61/182,464, filed May 29, 2009, and (c) U.S. Provisional Application No. 61/230,051, filed Jul. 30, 2009.

PCT Application No. PCT/US2010/036569, U.S. Provisional Application No. 61/182,464, U.S. Provisional Application No. 61/230,051, PCT Application No PCT/US2009/066114, U.S. Provisional Application No. 61/119,303, PCT Application No PCT/US2009/066111, U.S. Provisional Application No. 61/119,248, PCT Application No PCT/US2009/066259, and U.S. Provisional Application No. 61/119,217 are incorporated herein by reference.

STATEMENT REGARDING FEDERALLY SPONSORED RESEARCH OR DEVELOPMENT

This invention was made with government support under W911NF-04-2-0005 awarded by the Army Research Office (ARMY/ARO). The government has certain rights in the invention.

FIELD OF THE INVENTION

This invention relates generally to processing semiconductors on flexible substrates, and relates more particularly to processing semiconductors on flexible substrates at high temperatures and the semiconductor devices therefrom.

BACKGROUND OF THE INVENTION

In the electronics industry, flexible substrates are quickly becoming popular as a base for electronic circuits. Flexible substrates can include a wide variety of materials, such as, for example, any of a myriad of plastics. Once a desired electronic component, circuit, or circuits are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

A need exists in the art to develop a process for fabricating semiconductor devices on flexible substrates that allows for improved electrical characteristics, such as, for example, improved parametric characteristics and/or lifetime, and reduced bowing, warping, and/or distortion.

BRIEF DESCRIPTION OF THE DRAWINGS

To facilitate further description of the embodiments, the following drawings are provided in which.

Figure 1:
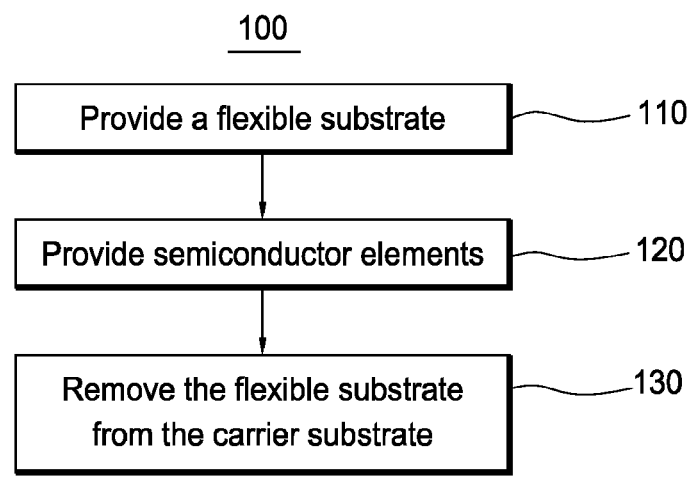
FIG. 1 illustrates an example of a method of providing a semiconductor device, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

Some embodiments include a method of providing a semiconductor device. The method can include: (a) providing a flexible substrate; (b) depositing at least one layer of material over the flexible substrate, wherein the deposition of the at least one layer of material over the flexible substrate occurs at a temperature of at least 180 degrees Celsius (° C.); and (c) providing a diffusion barrier between a metal layer and an amorphous silicon layer.

In another embodiment, a method of providing a semiconductor device can include: (a) providing a carrier substrate; (b) providing a flexible substrate, which can be planarized; (c) coupling the carrier substrate to the flexible substrate; (d) depositing a gate metal layer over the substrate; (e) depositing one or more one silicon comprising layers over the gate metal layer, wherein the temperature of the deposition reaches at least 180° C.; (f) depositing one or more contact elements over the one or more silicon comprising layers, wherein the one or more contact elements can have a diffusion barrier; (g) depositing a first dielectric material over the one or more contact elements, wherein the first dielectric material comprises an organic siloxane-based dielectric material; (h) depositing a second dielectric material over the first dielectric material, wherein the second dielectric material comprises silicon nitride; and (i) baking the first dielectric material, the second dielectric material, the flexible substrate, the carrier substrate, the gate metal layer, the one or more silicon comprising layers, and the one or more contact elements, wherein the temperature of the baking reaches at least 200° C.

Other embodiments include a semiconductor device. The semiconductor device can include: (a) a flexible substrate; (b) a metal gate layer over the flexible substrate; (c) an amorphous silicon layer over a silicon nitride gate dielectric, wherein the amorphous silicon layer is deposited during a process at a temperature of at least 180° C.; (d) an N+ amorphous silicon layer; (e) a metal layer; and (f) a diffusion barrier, wherein the diffusion barrier is positioned between the metal layer and the N+ amorphous silicon layer.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate.

The term "CTE matched material" as used herein means a material that has a coefficient of thermal expansion (CTE) which differs from the CTE of a reference material by less than about 20 percent (%). Preferably, the CTEs differ by less than about 10%, 5%, 3%, or 1%. As used herein, "polish" can mean to lap and polish a surface or to only lap the surface.

Turning to the drawings, FIG. 1 illustrates an example of a method 100 of providing a semiconductor device, according to a first embodiment. In the same or different embodiments, method 100 can be considered a method of providing a thin film transistor on a flexible substrate. Method 100 is merely exemplary and is not limited to the embodiments presented herein. Method 100 can be employed in many different embodiments or examples not specifically depicted or described herein.

Figure 2:
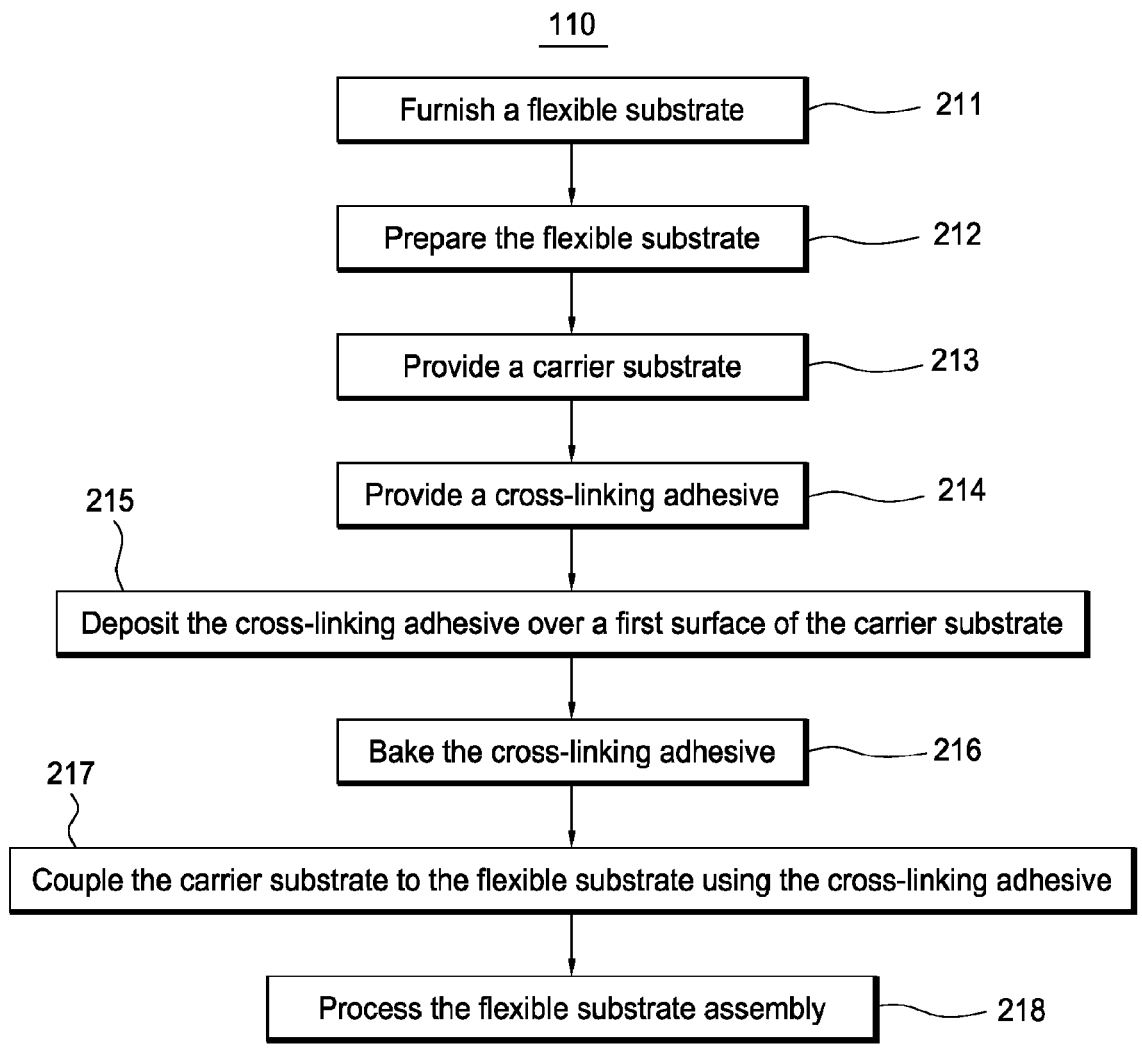
FIG. 2 illustrates an example of a procedure of providing a flexible substrate, according to the first embodiment.

Method 100 includes a procedure 110 of providing a flexible substrate. FIG. 2 is a flow chart illustrating procedure 110 of providing a flexible substrate, according to the first embodiment.

Procedure 110 includes a process 211 of furnishing a flexible substrate. The term "flexible substrate" as used herein means a free-standing substrate comprising a flexible material which readily adapts its shape. In some embodiments, process 211 can include furnishing a flexible substrate with a low elastic modulus. For example, a low elastic modulus can be considered an elastic modulus of less than approximately five GigaPascals (GPa).

In many examples, the flexible substrate is a plastic substrate. For example, flexible substrates can include polyethylene naphthalate (PEN), polyethylene terephthalate (PET), polyethersulfone (PES), polyimide, polycarbonate, cyclic olefin copolymer, or liquid crystal polymer.

In many examples, the flexible substrate can include a coating at one or more sides of the flexible substrate. The coating can improve the scratch resistance of the flexible substrate and/or help prevent outgassing or oligomer crystallization on the surface of the substrate. Moreover, the coating can planarize the side of the flexible substrate over which it is located. The coating also can help decrease distortion. In some examples, the coating is located only at the side of the flexible substrate where the electrical device will be fabricated. In other examples, the coating is at both sides of the flexible substrate. In various embodiments the flexible substrate can be provided pre-planarized. For example, the flexible substrate can be a PEN substrate from DuPont Teijin Films of Tokyo, Japan, sold under the tradename "planarized Teonex® Q65." In other embodiments, a flexible substrate can be planarized after being provided. For example, method 2700 (FIG. 27) provides a method of planarizing a substrate.

The thickness of the flexible or plastic substrate can be in the range of approximately 25 micrometers (μm) to approximately 300 μm. In the same or different embodiments, the thickness of the flexible or plastic substrate can be in the range of approximately 100 μm to approximately 200 μm.

In some examples, the flexible substrate can be provided by cutting a sheet of a plastic substrate from a roll of the plastic material using a paper cutter or a pair of ceramic scissors. In various examples, after cutting the plastic substrate, the cut sheet is blown clean with a nitrogen gun. In some embodiments of procedure 110, either or both of the cutting and blowing processes can be part of a process 212, described below, instead of being part of process 211.

Figure 3:
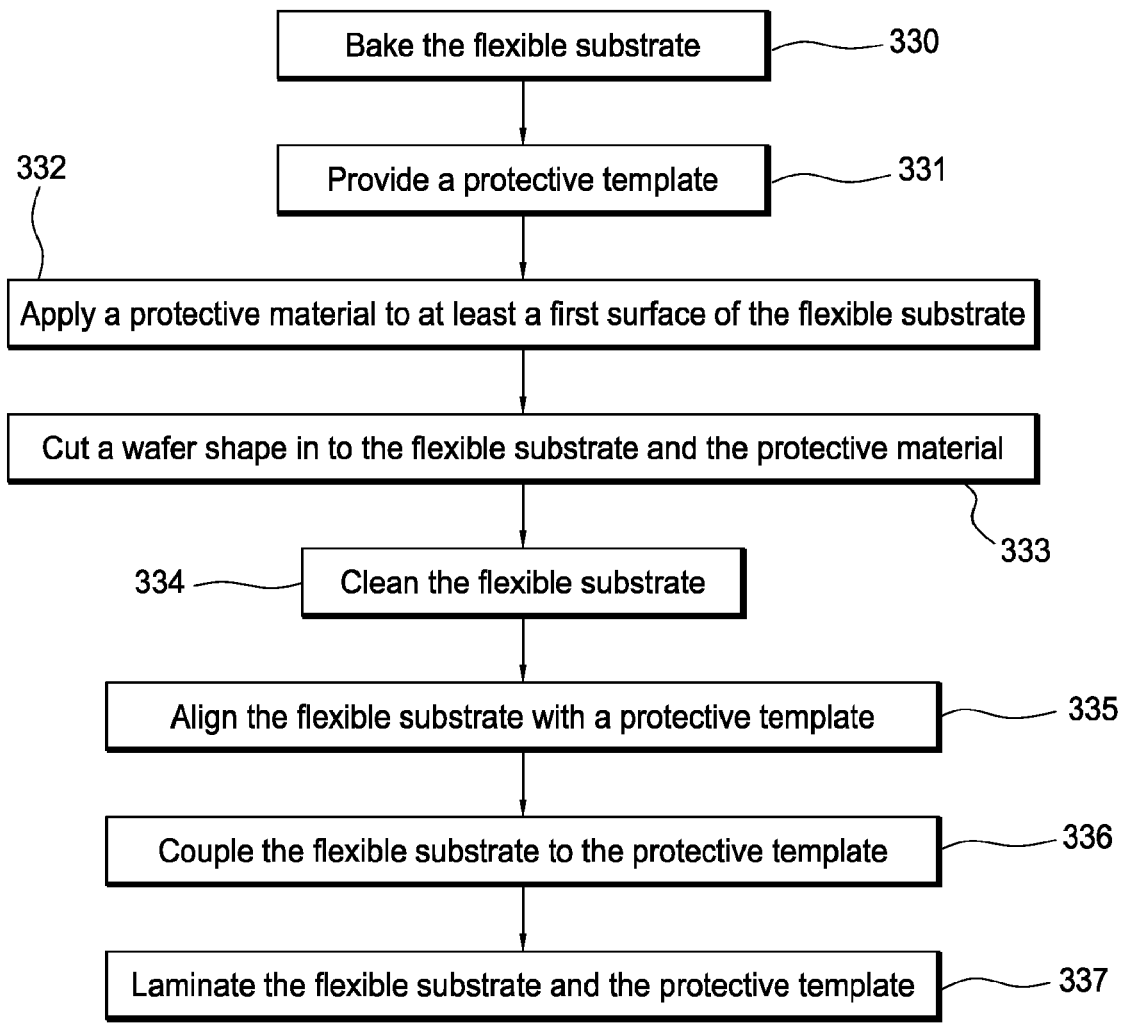
FIG. 3 illustrates an example of a process of preparing the flexible substrate, according to the first embodiment.

Procedure 110 of FIG. 2 continues with process 212 of preparing the flexible substrate. FIG. 3 is a flow chart illustrating process 212 of preparing the flexible substrate, according to the first embodiment.

Process 212 of FIG. 2 can include an activity 330 of baking the flexible substrate. Baking the flexible substrate can help release oligomers and other chemicals in the flexible substrate that could potentially leach out later during method 100 (FIG. 1).

In some examples, the flexible substrate can be baked using a vacuum bake process. For example, the temperature in an oven containing the flexible substrate can be ramped up over approximately two to three hours to approximately 160 degrees Celsius (° C.) to approximately 200° C. The flexible substrate can be baked for one hour at approximately 160° C. to approximately 200° C. and at a pressure of approximately one milliTorr (mTorr) to approximately ten mTorr. Then, the temperature in the oven can be lowered to between approximately 90° C. to approximately 115° C., and the flexible substrate can be baked for approximately eight more hours. Other baking processes can be also be used. After the baking process is complete, the flexible substrate can be wiped clean of any residues or chemicals that were baked off.

Subsequently, process 212 of FIG. 3 includes an activity 331 of providing a protective template. The protective template can act as both a guide for the placement of the flexible substrate as well as a protective layer between the flexible substrate and the rollers and/or handling mechanisms of various processing equipment. In some examples, the protective template is a sheet of mylar or any inexpensive plastic.

The protective template can be 50 μm to 15 mm thick and cut to a length of approximately 0.5 m (meters) to approximately 1.5 m. In various embodiments, as part of activity 331, the protective template is folded in half and run through rollers (e.g., a hot roll laminator) to help lock in the fold. A line trace of a carrier substrate can also be made on the back side of the protective sheet as part of activity 331. Additionally, the protective template can be baked at approximately 90° C. to approximately 110° C. for approximately five minutes to approximately ten minutes to help flatten the protective template.

Process 212 of FIG. 3 continues with an activity 332 of applying a protective material to at least a portion of a first surface of the flexible substrate. In some embodiments, a protective material can be applied over at least a portion of a planarized surface of the flexible substrate. In some examples, the protective material is not applied to a portion of the flexible substrate.

The protective material prevents scratches and adhesive from covering the planarized surface of the flexible substrate and, thus, reduces defects. In some examples, blue low tack tape (e.g., from Semiconductor Equipment Corporation, part number 18133-7.50) or mylar could be used as the protective material. The protective material can be approximately 25 μm to approximately 100 μm thick. For example, the protective material can be approximately 70 μm thick. In some examples, the protective material is applied by rolling the protective material onto the planarized surface of the flexible substrate using a roller to remove air bubbles between the protective material and the flexible substrate.

Subsequently, process 212 of FIG. 3 includes an activity 333 of cutting the flexible substrate and protective material into the shape of a wafer. A punch cut template can be used to press the wafer shape into the flexible substrate (with the planarized side, if any, up) and/or the protective material. In one embodiment, the punch cut template is used to create a temporary or permanent impression in the protective material and the flexible substrate at the same time.

If the pressing of the punch cut template cuts completely through the flexible substrate, the flexible substrate is scrapped because the press cut can create cracks in a coating on the flexible substrate that propagate throughout the flexible substrate. After the wafer shape is outlined into the flexible substrate and/or the protective material using the press, the flexible substrate and the protective material are cut simultaneously with each other. In some examples, the flexible substrate and protective material are cut using ceramic scissors approximately one millimeter outside the impression made by the punch cut template.

Figure 4:
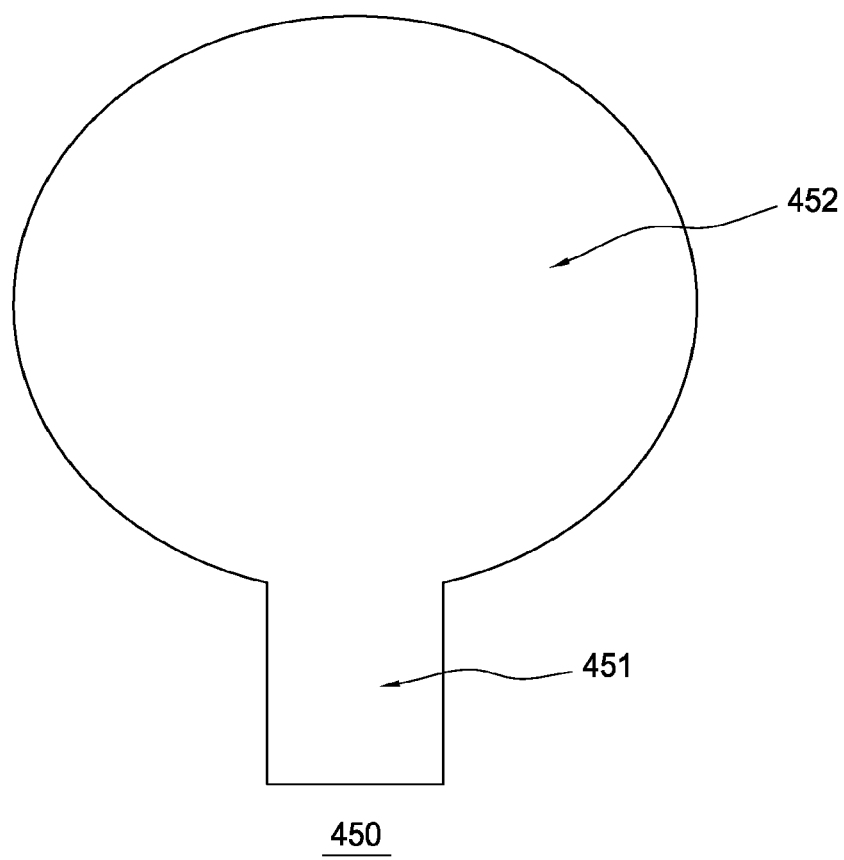
FIG. 4 illustrates a top view of an example of the flexible substrate according to the first embodiment.

In some examples, the flexible substrate includes a tab extending from the wafer shape in the flexible substrate and the protective material. The tab can be used to help align the flexible substrate to a carrier substrate when traveling through a laminator in process 217 of FIG. 2. FIG. 4 illustrates a top view of a flexible substrate 450, according to a first embodiment. Flexible substrate 450 can include a body 452 and tab 451. In many examples, body 452 can have a circular shape. Although not illustrated in FIG. 4, the protective material is located over flexible substrate 450 also includes a similarly shaped tab. In one embodiment, the tab is not part of the punch cut template and is cut freehand or freestyle into the flexible substrate and the protective material.

Referring back to FIG. 3, process 212 of FIG. 3 continues with an activity 334 of cleaning the flexible substrate. In some examples, the second or non-planarized side of the flexible substrate (i.e., the side without the protective material) is dry wiped to remove any oligomers, other chemicals, or particles. Afterwards, the planarized side of the flexible substrate having the protective material is blown clean with a nitrogen gun. In other examples, both sides of are dry wiped and/or blown clean.

Next, process 212 of FIG. 3 includes an activity 335 of aligning the flexible substrate with a protective template. In some examples, the flexible substrate having the wafer shape with the tab is aligned with the line trace of a carrier substrate drawn or made on the protective template in activity 331. The line trace of the carrier substrate is typically slightly larger than the wafer shape of the flexible substrate.

Subsequently, process 212 of FIG. 3 includes an activity 336 of coupling the flexible substrate to the protective template. In some embodiments, the flexible substrate is attached to the protective template by attaching a portion of the tab of the flexible substrate to the protective template. For example, a piece of double-sided tape can couple the tab of the flexible substrate to the protective template. In some examples, a portion of the protective material is peeled off of and removed from the tab, and the double-sided tape is coupled to the exposed portion of the tab of the flexible substrate. In some examples, the portion of the protective material can be peeled using tweezers and can be cut from the protective template using a pair of ceramic scissors. In other examples, in activity 332 of FIG. 3, the protective material is not applied to the portion the tab to which the double-sided tape will be attached so peeling and removal of a portion of the protective material is not necessary.

Figure 5:
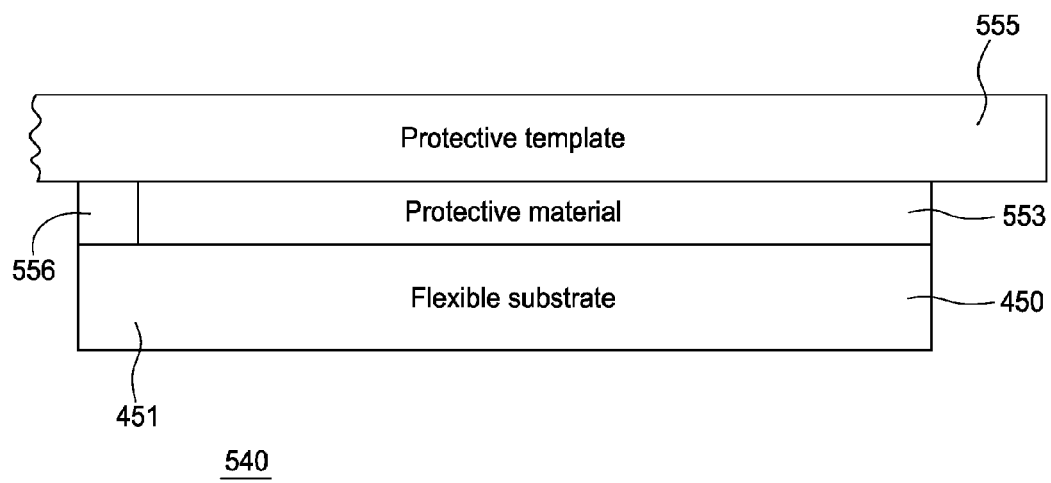
FIG. 5 illustrates a partial cross-sectional view of an example of a flexible substrate assembly after attaching the flexible substrate of FIG. 4 to a protective template, according to the first embodiment.

After coupling the flexible substrate to the protective coating, the protective template is then folded over the flexible substrate. FIG. 5 illustrates a partial cross-sectional view of a flexible substrate assembly 540 after attaching flexible substrate 450 to a protective template 555, according to the first embodiment. In this example, a tape 556 is coupled to flexible substrate 450 and protective template 555. A protective material 553 is coupled to flexible substrate 450, as described previously.

In some examples, only one side of the flexible substrate is attached to the protective template. In other examples, both sides of the flexible substrate are attached to the protective template.

Next, process 212 of FIG. 3 includes an activity 337 of laminating the flexible substrate, the protective material, and the protective template. The flexible substrate and the protective material are located between the two folded halves of the protective template. The flexible substrate, the protective material, and the protective template can be laminated using a hot roll laminator to remove air bubbles between the protective material and the protective template and also between the protective material and the flexible substrate. In some examples, the flexible substrate and the protective template are placed over a guide sheet (e.g., a Lexan® guide sheet) and fed into the hot roll laminator. As an example, the tab of the flexible substrate and the protective material can be fed first into the laminator. The flexible substrate and the protective template are laminated at a pressure of approximately 120 kPa (kilopascals) to approximately 160 kPa and at a temperature of approximately 90° C. to approximately 110° C. The lamination speed can be approximately one meter per minute to approximately two meters per minute.

After laminating the flexible substrate and protective template, process 212 is complete. Referring back to FIG. 2, procedure 110 of FIG. 2 includes a process 213 of providing a carrier substrate. In many embodiments, the carrier substrate can be a 6, 8, 12, or 18 inch wafer or panel. In some embodiments the carrier substrate can be a panel of approximately 370 mm by 470 mm.

The carrier substrate can include a first surface and a second surface opposite the first surface. In some examples, at least one of the first surface and the second surface has been polished. Polishing the surface that is not subsequently coupled to the flexible substrate improves the ability of a vacuum or air chuck to handle the carrier substrate. Also, polishing the surface that is subsequently coupled to the flexible substrate removes topological features of the surface of the carrier substrate that could cause roughness of the flexible substrate assembly in the z-axis after the coupling with the flexible substrate.

In various embodiments, the carrier substrate comprises at least one of the following: alumina ($Al_2O_3$), silicon, low CTE glass, steel, sapphire, barium borosilicate, soda lime silicate, an alkali silicate, or another material that is CTE matched to the flexible substrate. The CTE of the carrier substrate should be matched to the CTE of the flexible substrate. Non-matched CTEs can create stress between the carrier substrate and the flexible substrate.

For example, the carrier substrate could comprise sapphire with a thickness between approximately 0.7 mm and approximately 1.1 mm. The carrier substrate could also comprise 96% alumina with a thickness between approximately 0.7 mm and approximately 1.1 mm. In a different embodiment, the thickness of the 96% alumina is approximately 2.0 mm. In another example, the carrier substrate could be a single crystal silicon wafer with a thickness of at least approximately 0.65 mm. In still a further embodiment, the carrier substrate could comprise stainless steel with a thickness of at least approximately 0.5 mm. In some examples, the carrier substrate is slightly larger than the flexible substrate.

Next, procedure 110 of FIG. 2 includes a process 214 of providing a cross-linking adhesive. In some examples, the cross-linking adhesive outgases at a rate of less than approximately $2 \times 10^{-4}$ Torr-liters per second. In some examples, the cross-linking adhesive is thermally and/or UV (ultraviolet) light curable.

In various embodiments, the cross-linking adhesive is a cross-linking acrylic adhesive. In the same or different embodiment, the cross-linking adhesive is a cross-linking pressure sensitive acrylic adhesive or a cross-linking viscoelastic polymer. In some examples, the CTE of the adhesive is very large compared to the CTE of the flexible substrate and the carrier substrate. However, the CTE of the adhesive is not important because the adhesive does not create any stress (i.e., viscoelasticity) between the flexible substrate and carrier substrate because the layer of adhesive is so thin compared to the thickness of the flexible substrate and carrier substrate.

Subsequently, procedure 110 of FIG. 2 includes a process 215 of depositing the cross-linking adhesive over a first surface of the carrier substrate. In many embodiments, depositing the cross-linking adhesive over a first surface of the carrier substrate can be performed using at least one of the following methods: spin-coating, spray-coating, extrusion coating, preform lamination, slot die coating, screen lamination, and screen printing.

For example, the carrier substrate can be coated with the cross-linking adhesive. The carrier substrate and the cross-linking adhesive can be spun to distribute the cross-linking adhesive over a first surface of the carrier substrate. In some embodiments, the cross-linking adhesive is spin coated on the carrier substrate by spinning the carrier substrate with the cross-linking adhesive at approximately 900 rpm (revolutions per minute) to 1100 rpm for approximately 20 seconds to approximately 30 seconds and then spinning the carrier substrate with the cross-linking adhesive at approximately 3400 rpm to approximately 3600 rpm for approximately 10 seconds to 30 seconds. In a different embodiment, the carrier substrate with the cross-linking adhesive is spun at approximately 600 rpm to approximately 700 rpm to coat the surface of the carrier substrate and then spun at approximately 3400 rpm to approximately 3600 rpm to control the thickness of the cross-linking adhesive.

Prior to spin coating, the cross-linking adhesive can be dispensed onto or over a geometric center of the carrier substrate. In a different embodiment, the cross-linking adhesive can be dispensed onto or over the carrier substrate while the carrier substrate is spinning.

The thickness of the cross-linking adhesive over the carrier substrate after the depositing procedure can be between approximately three μm and approximately fifteen μm. In the same or different embodiment, the thickness of the cross-linking adhesive over the carrier substrate after the depositing procedure can be between approximately ten μm and approximately twelve μm.

Procedure 110 of FIG. 2 continues with a process 216 of baking the cross-linking adhesive. In some embodiments, the cross-linking adhesive can be baked to remove solvents. For example, the cross-linking adhesive can be baked at 80° C. for thirty minutes and then baked for fifteen minutes at 130° C.

In other examples, the cross-linking adhesive is not baked. For example, if the cross-linking adhesive does not include any solvents, a bake is not necessary. Moreover, if the cross-linking adhesive is very viscous, solvents may even be added to the cross-linking adhesive to decrease the viscosity before the adhesive is deposited in process 215.

Figure 6:
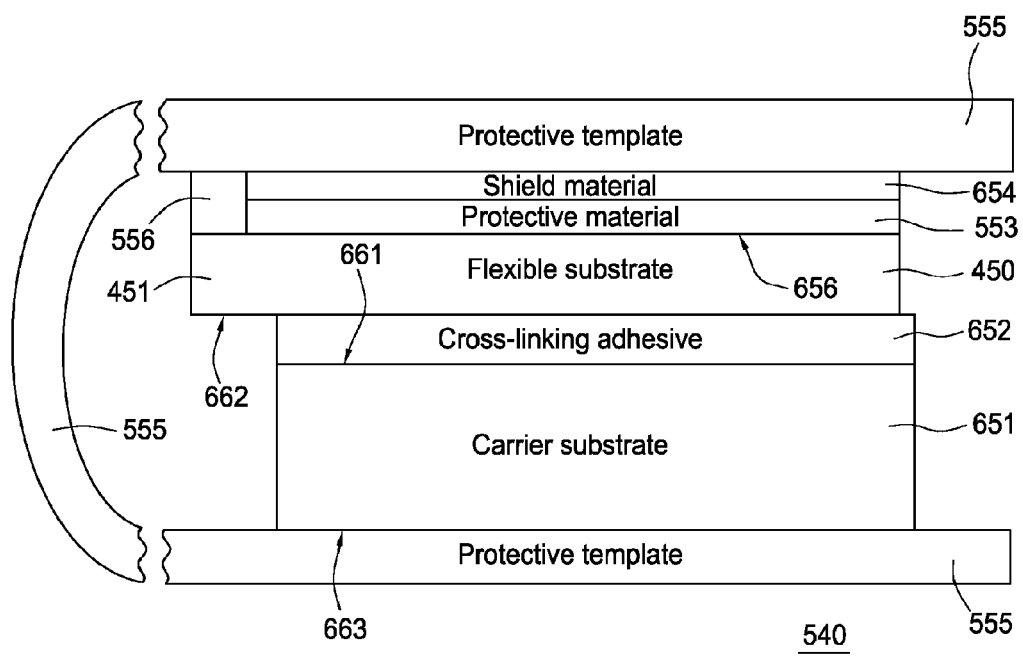
FIG. 6 illustrates a partial cross-sectional view of an example of the flexible substrate assembly of FIG. 5 after coupling a carrier substrate to the flexible substrate assembly, according to the first embodiment.

Afterwards, the carrier substrate can be placed on the protective template. The flexible substrate is already coupled to one portion (or half) of the protective template as shown in FIG. 6, and the carrier substrate with cross-linking adhesive can be placed on another portion (or half) of the protective template. In some examples, the cross-linking adhesive is still in liquid form at this point. Thus, the carrier substrate coated with the cross-linking adhesive can be stored horizontally for approximately eight to approximately twelve hours before being coupled with the flexible substrate.

Next, procedure 110 of FIG. 2 includes a process 217 of coupling the carrier substrate to the flexible substrate using the cross-linking adhesive while both substrates are located between the protective template halves. The second surface of the flexible substrate can be placed over the first surface of the carrier substrate with the adhesive located between the second surface of the flexible substrate and the first surface of the carrier substrate.

In some examples, the carrier substrate is coupled to the flexible substrate using the cross-linking adhesive by laminating the flexible substrate assembly between the protective template halves to remove air bubbles between the carrier substrate and the flexible substrate. Laminating the flexible substrate involves first aligning the carrier substrate with the flexible substrate so that, when laminated, the carrier substrate and the flexible substrate are aligned. Then, the aligned structure can be fed through a hot roll laminator, which can be the same laminator of activity 337 of FIG. 3. The flexible substrate assembly can be laminated at an approximate speed of 0.4 to 0.6 meters per minute.

Also, in various embodiments, the protective material may stick to the protective template when laminated. To avoid this problem, a shield material can be located between the protective template and the protective material before the lamination of activity 337 and/or activity 332. The shield material can be, for example, wax paper. In one embodiment, the shield material is originally coupled to the protective material when acquired from the manufacturer.

In the same or different embodiments, some of the cross-linking adhesive can be squeezed out from between the carrier and flexible substrates during lamination and adhere to the first side or the top of the flexible substrate, particularly because the carrier substrate and the overlying cross-linking adhesive layer is slightly larger than the flexible substrate. The presence of the protective material, however, prevents this problem from occurring. The cross-linking adhesive that squeezes out and adheres to the top of the protective material (instead of the flexible substrate) is inconsequential because the protective material is eventually removed and discarded.

FIG. 6 illustrates a partial cross-sectional view of flexible substrate assembly 540 after coupling a carrier substrate 651 to flexible substrate assembly 540, according to the first embodiment. In this embodiment, a cross-linking adhesive 652 couples a surface 661 of carrier substrate 651 to a surface 662 of flexible substrate 450. Protective material 553 is located over a surface 656 of flexible substrate 450. A shield material 654 is located between protective material 553 and protective template 555. Protective template 555 is folded such that protective template 555 is also located under a surface 663 of carrier substrate 651. Tape 556 couples protective template 555 to tab 451 of flexible substrate 450.

Figure 7:
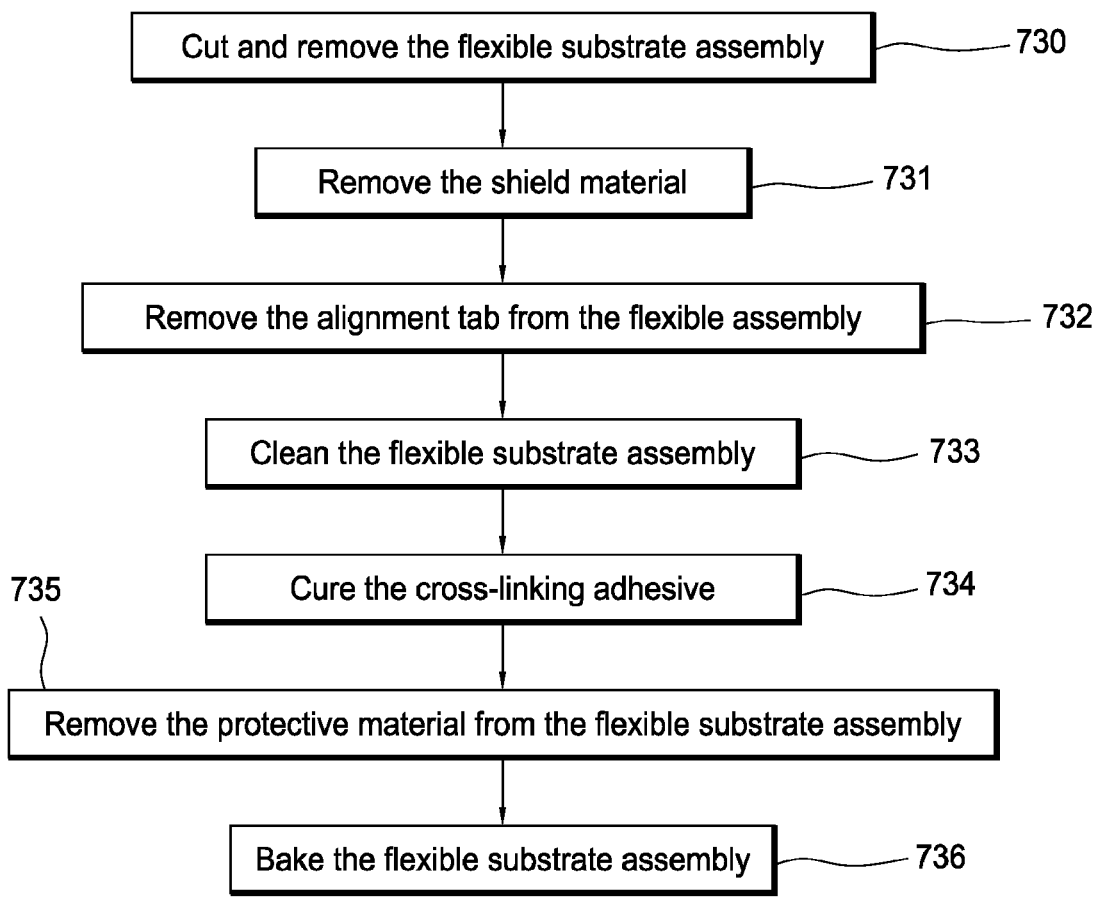
FIG. 7 illustrates an example of a process of processing the flexible substrate assembly of FIG. 5, according to the first embodiment.

Referring again back to FIG. 2, procedure 110 continues with a process 218 of processing the flexible substrate assembly. FIG. 7 is a flow chart illustrating process 218 of processing the flexible substrate assembly, according to the first embodiment.

Figure 8:
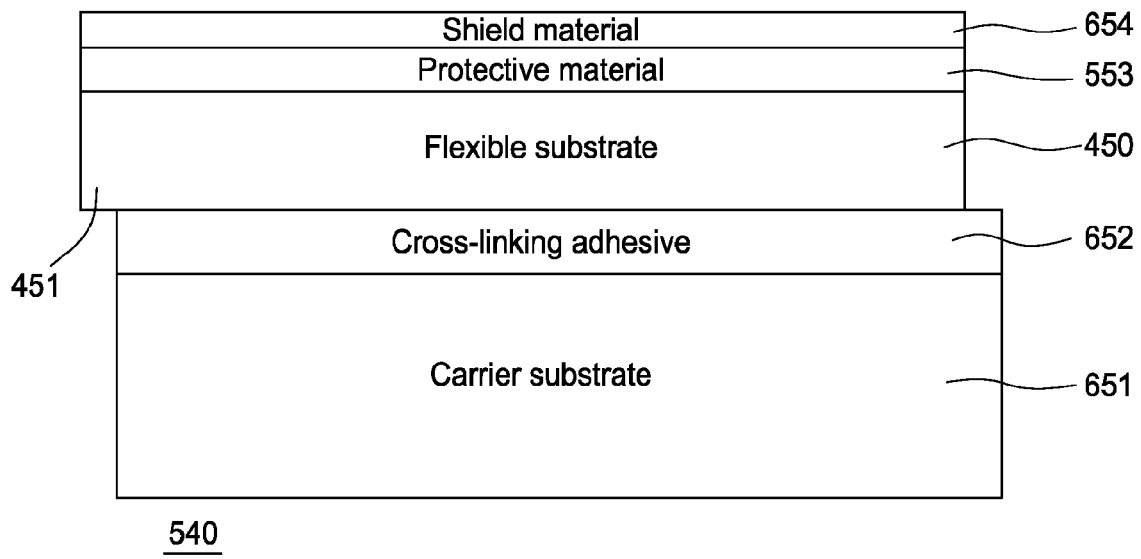
FIG. 8 illustrates a cross-sectional view of an example of the flexible substrate assembly of FIG. 5 after cutting the flexible substrate assembly, according to the first embodiment.

Process 218 of FIG. 7 includes an activity 730 of cutting the flexible substrate assembly. In some examples, a pair of ceramic scissors is used to cut the protective template and across the alignment tab of the flexible substrate located between the protective template, but the alignment tab is not removed entirely. After cutting the flexible substrate assembly, the protective template can be peeled away from or otherwise removed from the shield material and the carrier substrate by hand. FIG. 8 illustrates a cross-sectional view of flexible substrate assembly 540 after cutting the flexible substrate assembly and removing the protective template, according to the first embodiment. More specifically, in FIG. 8, protective template 555 (FIGS. 5 & 6), and tape 556 (FIGS. 5 & 6) of flexible substrate 450 have been removed.

Referring again to FIG. 7, the next activity in process 218 is an activity 731 of removing the shield material by hand. In some examples, the flexible substrate assembly is placed at an edge of a table with the shield material facing the table. The flexible substrate assembly is slowly moved off the table while the shield layer is removed (e.g., peeled) from the flexible substrate assembly. That is, the shield layer can be removed by pulling the shield material downward away from the edge of the table while the flexible substrate assembly is moved horizontally off the table. In some examples, if the flexible substrate is not properly centered on or otherwise aligned with the carrier substrate after removing the shield layer, the plastic substrate can be slid into alignment with the carrier substrate.

Figure 9:
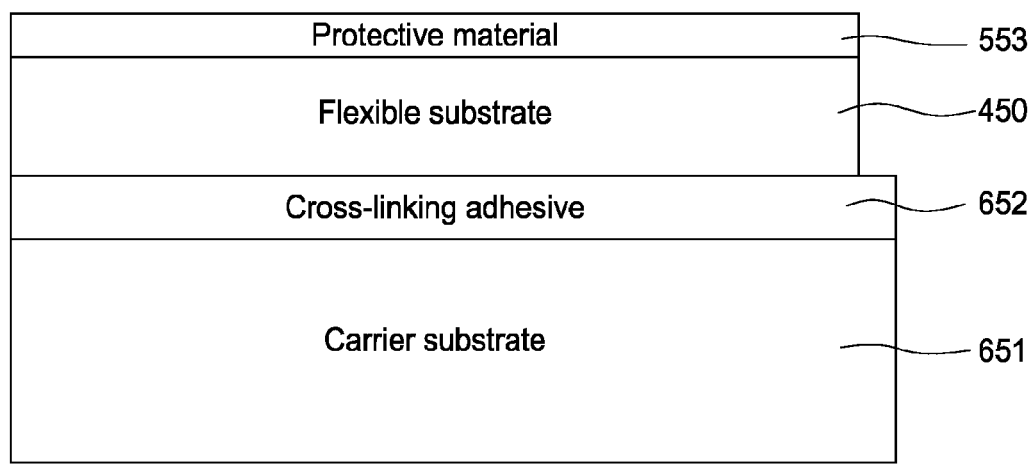
FIG. 9 illustrates a cross-sectional view of an example of the flexible substrate assembly of FIG. 5 after removing an alignment tab, according to the first embodiment.

Subsequently, process 218 of FIG. 7 includes an activity 732 of removing the alignment tab from the flexible assembly. In some examples, the alignment tab can be cut from the flexible substrate using ceramic scissors. The cut should be made slowly as any movement of the flexible substrate in the z-direction (relative to the carrier substrate) might cause de-lamination of the flexible substrate from the carrier substrate. If de-lamination occurs, the flexible substrate assembly can be re-laminated. FIG. 9 illustrates a cross-sectional view of flexible substrate assembly 540 after removing the alignment tab, according to the first embodiment.

Next, process 218 of FIG. 7 includes an activity 733 of cleaning the flexible substrate assembly. In some examples, the flexible substrate assembly is cleaned with hexanes. The hexanes can be applied by spinning the flexible substrate assembly and spraying the hexanes on the protective material. After the protective material is cleaned, the exposed surface and edge of the carrier substrate is wiped clean with hexanes.

Procedure 218 of FIG. 7 continues with an activity 734 of curing the cross-linking adhesive. In the same or different embodiment, the cross-linking adhesive is UV cured. For example, the flexible substrate assembly can be exposed to UV light for approximately 15 to 25 seconds and room temperature to cure the cross-linking adhesive. In some embodiments, the cross-linking adhesive can be cured with UV light in the UV light range of approximately 320 nm (nanometers) to approximately 390 nm and with an intensity of approximately 75 mW/cm$^2$ (milliWatts per square centimeter). A Dymax 2000-EC UV Curing Flood Lamp, manufactured by Dymax Corporation of Torrington, Conn., can be used to cure the cross-linking adhesive.

In various examples, the cross-linking adhesive is thermally cured during the baking in activity 736. In some examples, the edges of the cross-linking adhesive are UV cured, and the rest of the cross-linking adhesive is thermally cured during the baking of activity 736.

Figure 10:
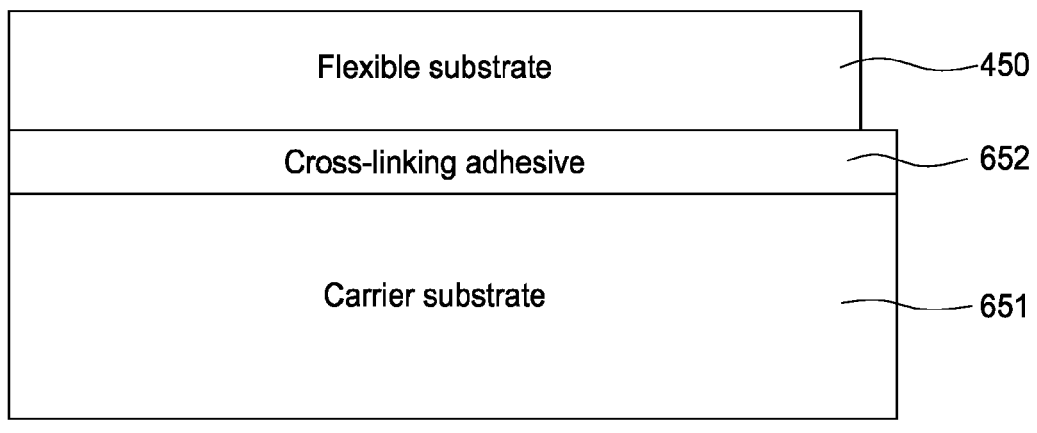
FIG. 10 illustrates a cross-sectional view of an example of the flexible substrate assembly of FIG. 5 after removing a protective material from the flexible substrate assembly, according to the first embodiment.

Subsequently, process 218 of FIG. 7 includes an activity 735 of removing the protective material from the flexible substrate assembly. In some examples, the protective material can be slowly removed using tweezers. During the removal process, the protective material is kept as flat as possible to avoid de-laminating the flexible substrate from the carrier substrate. In other examples, the protective material can be releasable by UV light. In these examples, the protective material would lose its tack during a UV light exposure. FIG. 10 illustrates a cross-sectional view of flexible substrate assembly 540 after removing the protective material from the flexible substrate assembly, according to the first embodiment.

Next, process 218 of FIG. 7 includes an activity 736 of baking the flexible substrate assembly. Baking the flexible substrate assembly can help decrease the distortion, bow, and warp in the flexible substrate. In some embodiments, baking can also cure the adhesive.

In some examples, the flexible substrate assembly can be baked using a vacuum bake process. For example, the temperature in an oven containing the flexible substrate assembly can be ramped up over two to three hours to approximately 160° C. to approximately 190° C. The flexible substrate assembly can be baked for approximately 50 minutes to 70 minutes at 180° C. and with a pressure of approximately 1 mTorr to approximately 10 mTorr. The temperature in the oven can then be lowered to between approximately 90° C. to 115° C., and the flexible substrate assembly can be baked for approximately seven more hours to approximately nine more hours. Other baking processes can be also be used. After the baking process is complete, the flexible substrate assemblies are cleaned and placed in an oven at approximately 90° C. to 110° C. for a minimum of approximately two hours.

After baking the flexible substrate assembly, process 218 is complete, and therefore, procedure 110 is also complete. Procedure 110, as described herein, and similar procedures can allow fabrication of one or more electrical components on a flexible substrate with zero or at least minimal distortion (e.g. approximately the limits of the sensitivity of an Azores 5200, manufactured by Azores Corporation of Wilmington, Mass.). Prior art methods of fabricating electrical components on the flexible substrate suffer from significant distortion problems that can lead to handling errors, photolithographic alignment errors, and line/layer defects.

Figure 11:
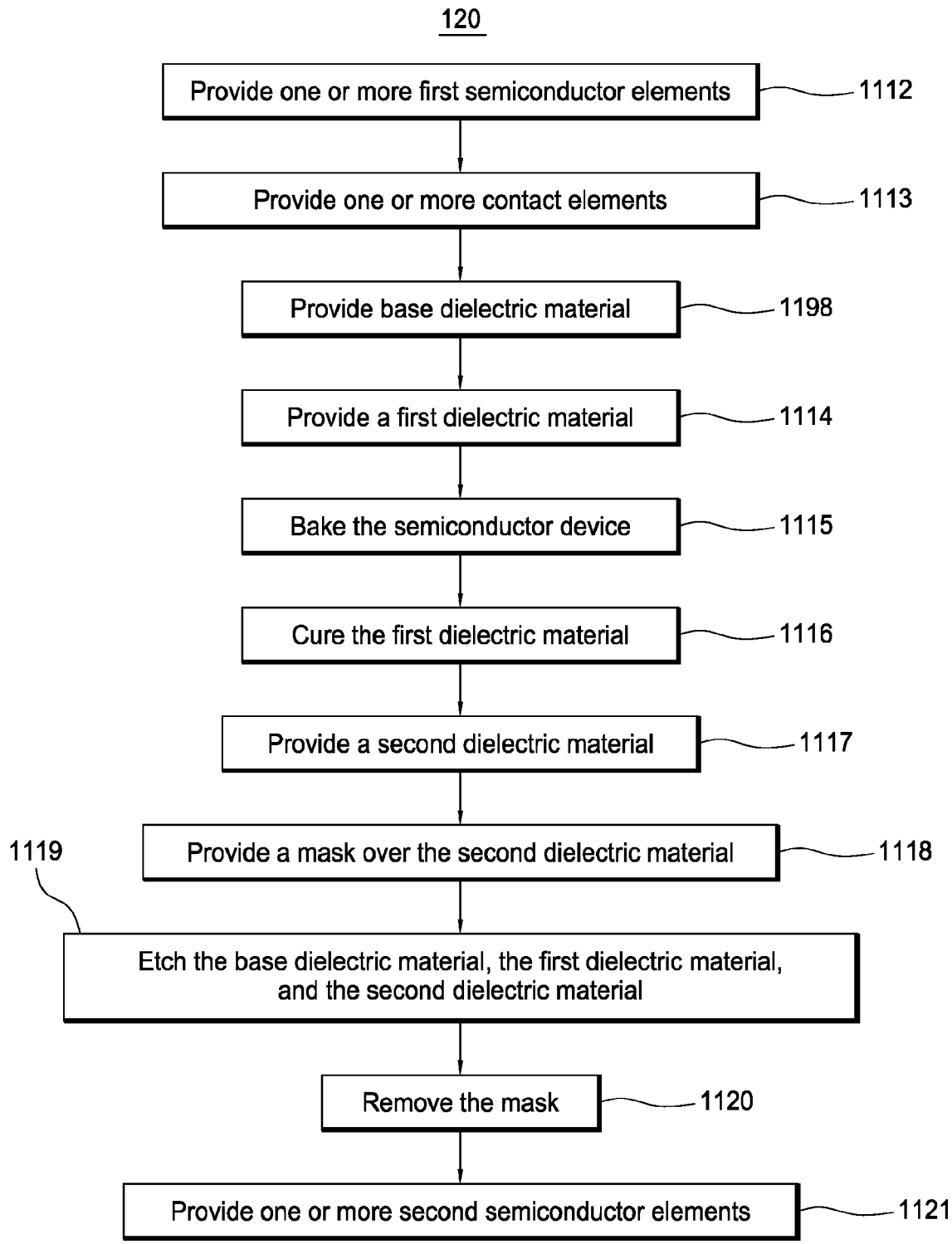
FIG. 11 illustrates an example of a procedure of providing semiconductor elements, according to the first embodiment.

Referring back to FIG. 1, method 100 includes a procedure 120 of providing semiconductor elements. FIG. 11 is a flow chart illustrating procedure 120 of providing semiconductor elements, according to the first embodiment.

Figure 12:
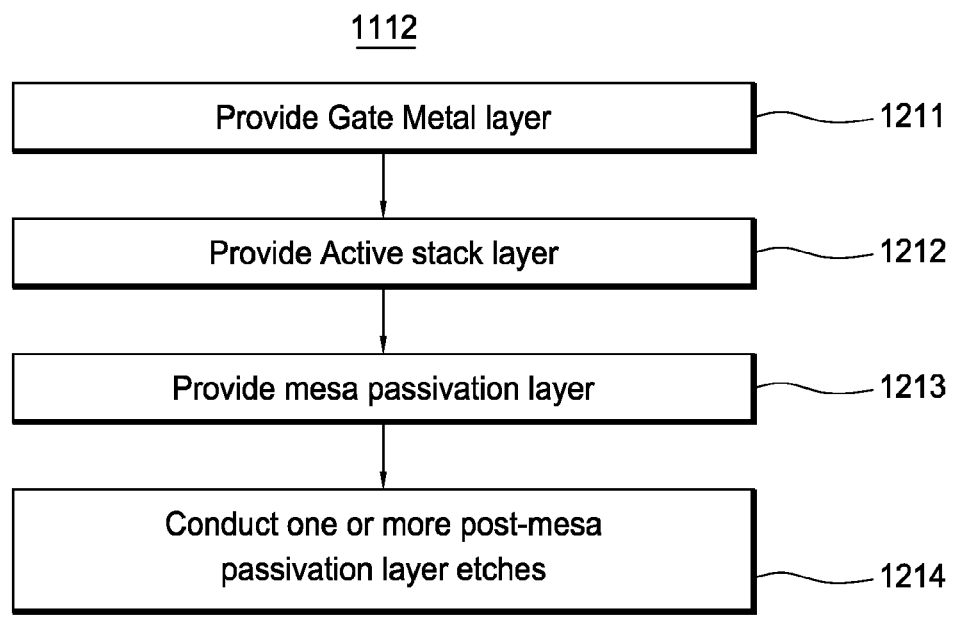
FIG. 12 illustrates an example of a process of providing one or more first semiconductor elements, according to the first embodiment.

Procedure 120 of FIG. 11 includes a process 1112 of providing one or more first semiconductor elements. FIG. 12 is a flow chart illustrating process 1112 of providing one or more first semiconductor elements, according to the first embodiment.

Figure 13:
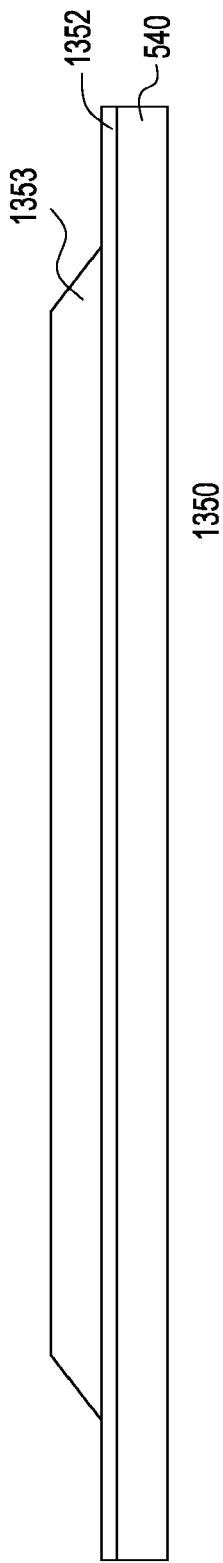
FIG. 13 illustrates a cross-sectional view of an example of a device build area of a semiconductor device after providing a gate metal layer, according to the first embodiment.
Figure 14:
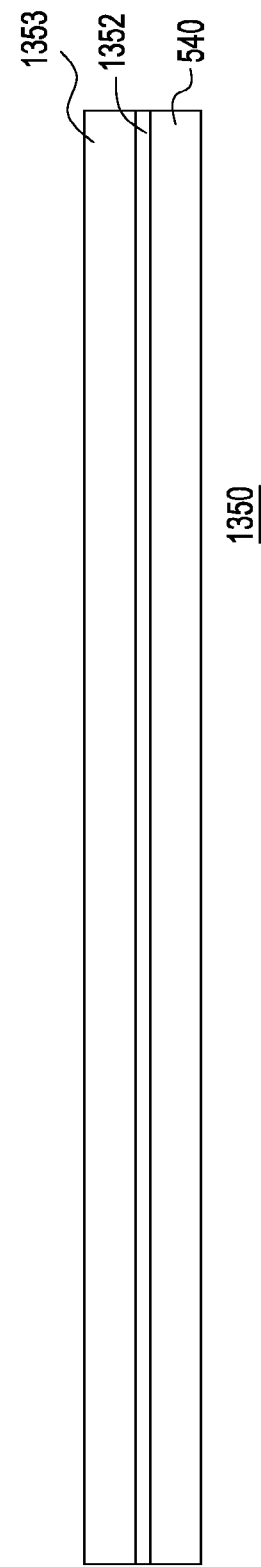
FIG. 14 illustrates a cross-sectional view of an example of a gate contact build area of a semiconductor device after providing the gate metal layer, according to the first embodiment.
Figure 29:
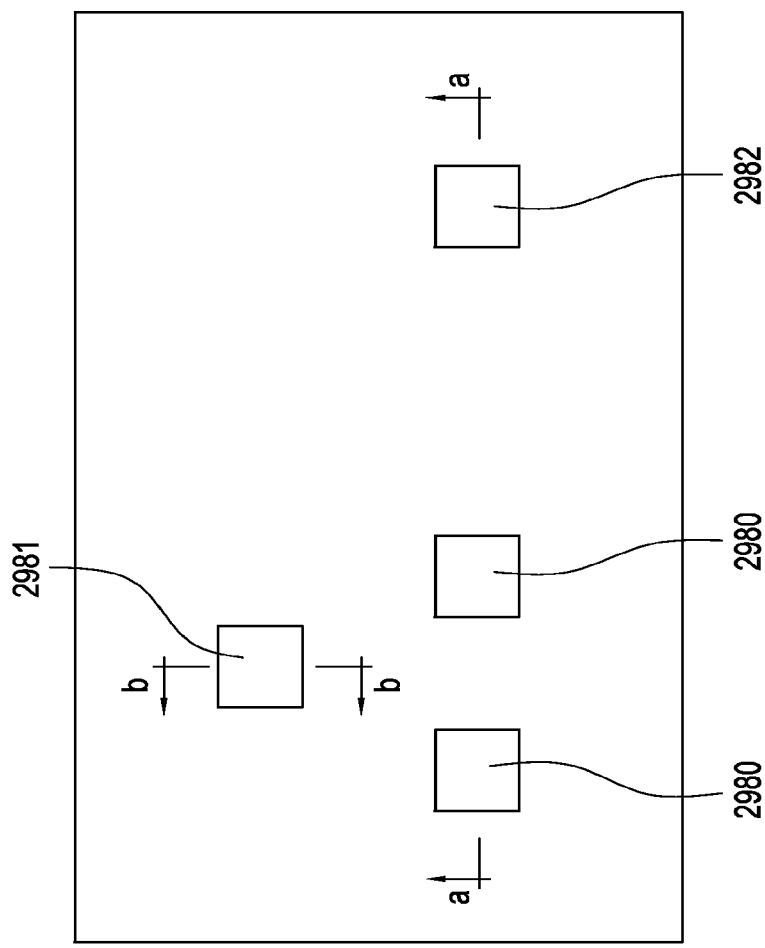
FIG. 29 illustrates a top view of a portion of a semiconductor device, according to the first embodiment.

Process 1112 in FIG. 12 includes an activity 1211 of providing a gate metal layer. FIG. 13 illustrates a cross-sectional view of a device build area of an example of a semiconductor device 1350 after providing a gate metal layer, according to the first embodiment. As can be seen in FIG. 29, the cross-sectional view of the device build area is the cross-sectional view of a portion of semiconductor device 1350 taken at the "a" lines. The device build cross sectional view comprises a cross-sectional view of a-Si contact areas 2980 and via area 2982. In addition, FIG. 14 illustrates a cross-sectional view of a gate contact build area of an example of semiconductor device 1350 after providing a gate metal layer, according to the first embodiment. As can be seen in FIG. 29, the cross-sectional view of the gate contact build area is the cross-sectional view of a portion of semiconductor device 1350 taken at the "b" lines. The gate contact build cross sectional view comprises a cross-sectional view of gate contact area 2981. FIG. 29 is merely exemplary and is not limited to the embodiments presented herein.

Referring to FIGS. 13 and 14, for example, an approximately 0.30 µm thick silicon nitride passivation layer 1352 is provided over flexible substrate assembly 540. Silicon nitride passivation layer 1352 can be provided over flexible substrate 450 (FIG. 10) of flexible substrate assembly 540. In some embodiments, flexible substrate 450 may baked prior to the deposition of silicon nitride passivation layer 1352.

In addition, a patterned metal gate 1353 can be provided over silicon nitride passivation layer 1352. Patterned metal gate 1353 can comprise molybdenum. In some examples, an approximately 0.15 µm layer of molybdenum can be deposited over silicon nitride passivation layer 1352 and then pattern etched to form patterned metal gate 1353. For example, molybdenum can be deposited over silicon nitride passivation layer 1352 by sputtering. In some examples, molybdenum can be deposited using a KDF 744, manufactured by KDF Electronic, Inc., of Rockleigh, N.J. In the same or different examples, patterned metal gate 1353 can be etched using an AMAT 8330, manufactured by Applied Material, Inc. of Santa Clara, Calif.

Figure 15:
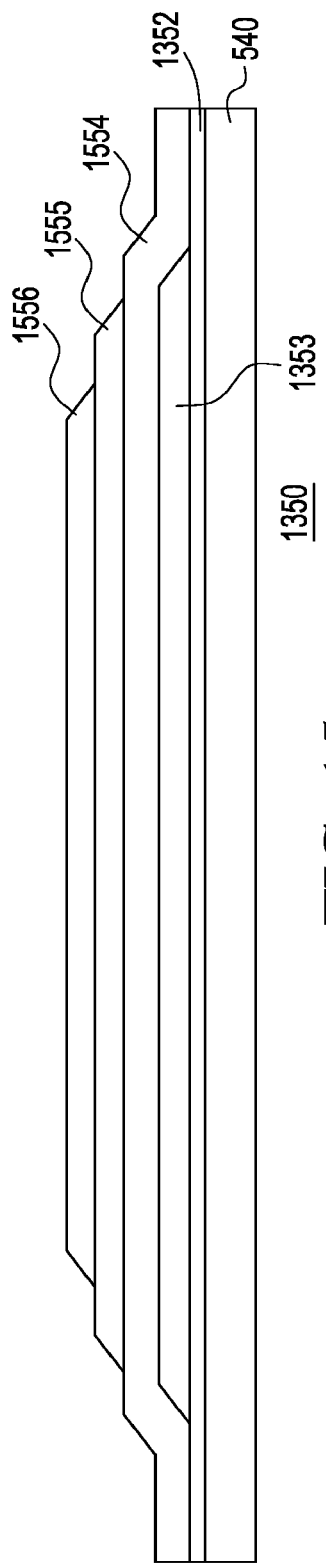
FIG. 15 illustrates a cross-sectional view of an example of the device build area of the semiconductor device of FIG. 13 after providing an active stack layer, according to the first embodiment.
Figure 16:
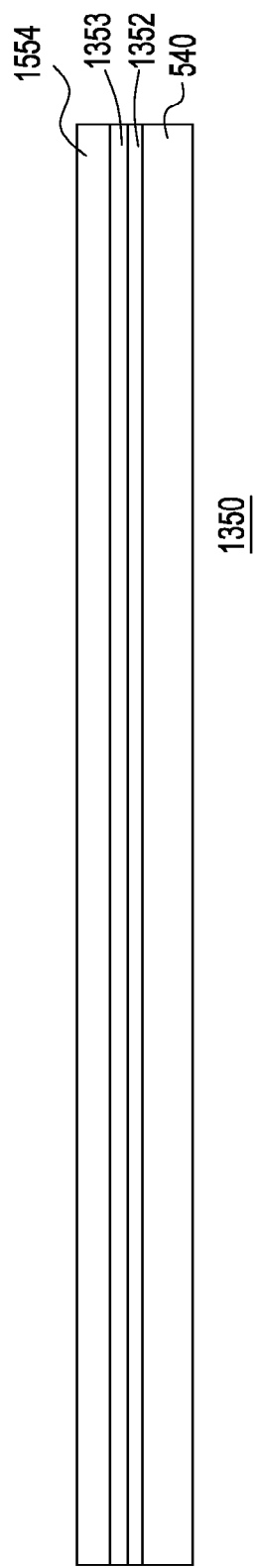
FIG. 16 illustrates a cross-sectional view of an example of the gate contact build area of the semiconductor device of FIG. 14 after providing the active stack layer, according to the first embodiment.

Subsequently, process 1112 of FIG. 12 includes an activity 1212 of providing an active stack. FIGS. 15 and 16 illustrate an example of semiconductor device 1350 after providing an active stack, according to the first embodiment.

Referring to FIGS. 15 and 16, for example a silicon nitride gate dielectric 1554 can be formed over patterned metal gate layer 1353 and silicon nitride passivation layer 1352. Referring to FIG. 15, for example, in the device build area of semiconductor device 1350, a patterned amorphous silicon (a-Si) layer 1555 can be provided over silicon nitride gate dielectric 1554, and a patterned silicon nitride intermetal dielectric (IMD) layer 1556 can be provided over a-Si layer 1555.

In some examples, as shown in FIGS. 15 and 16, silicon nitride gate dielectric 1554 can be deposited onto semiconductor device 1350 over metal gate layer 1353 and silicon nitride passivation layer 1352 by way of plasma-enhanced chemical vapor deposition (PECVD). In the same or different examples, silicon nitride gate dielectric 1554 can be approximately 0.30 µm thick.

With reference to FIG. 15, as an example, a-Si layer 1555 can be deposited over silicon nitride gate dielectric 1554 by way of PECVD. In the same or different examples, a-Si layer 1555 can be approximately 0.08 µm thick.

Also, as an example, silicon nitride IMD layer 1556 can be deposited over a-Si layer 1555 by way of PECVD. In the same or different examples, silicon nitride IMD layer 1556 can be approximately 0.10 µm thick.

In some examples, silicon nitride gate dielectric 1554, a-Si layer 1555, and silicon nitride IMD layer 1556 can all be deposited via PECVD using an AMAT P5000, manufactured by Applied Materials, Inc. of Santa Clara, Calif. In the same or different examples, the temperature at which silicon nitride gate dielectric 1554, a-Si layer 1555, and silicon nitride IMD layer 1556 are deposited onto semiconductor device 1350 is greater than approximately 180° C. For example, the temperature at which silicon nitride gate dielectric 1554, a-Si layer 1555, and silicon nitride IMD layer 1556 are deposited onto semiconductor device 1350 is from approximately 180° C. to approximately 250° C. As an example, the temperature at which silicon nitride gate dielectric 1554, a-Si layer 1555, and silicon nitride IMD layer 1556 are deposited onto semiconductor device 1350 is from approximately 188° C. to approximately 193° C. Furthermore, the deposition of silicon nitride gate dielectric 1554, a-Si layer 1555, and silicon nitride IMD layer 1556 onto semiconductor device 1350 can be done at approximately vacuum.

After silicon nitride gate dielectric 1554, a-Si layer 1555, and silicon nitride IMD layer 1556 are deposited onto semiconductor device 1350, the resulting layers can be etched. For example, silicon nitride can be etched using a 10:1 buffered oxide etch (BOE). In addition, a-Si layer 1555 can be etched using an AMAT 8330. In some examples, silicon nitride IMD layer 1556 and a-Si layer 1555 are etched so that a-Si layer 1555 is exposed, i.e., a-Si layer 1555 is not completely covered by silicon nitride IMD layer 1556.

Figure 17:
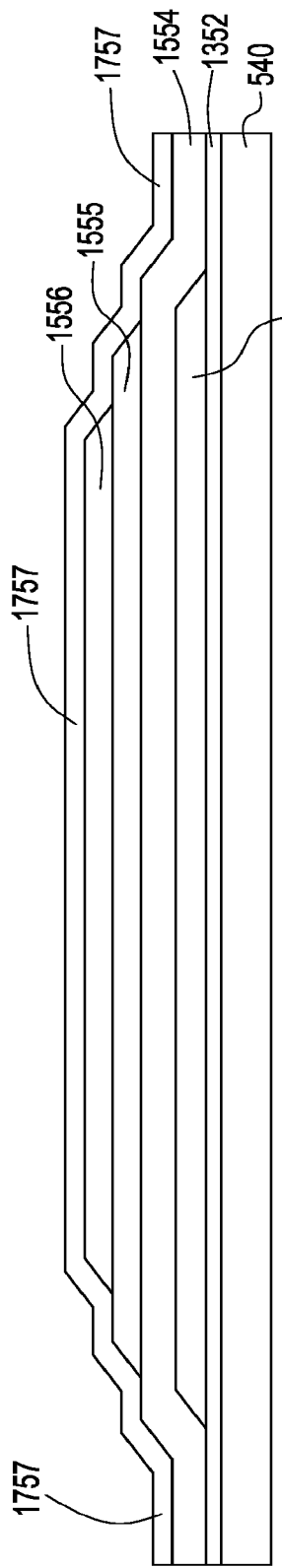
FIG. 17 illustrates a cross-sectional view of an example of the device build area of the semiconductor device of FIG. 13 after providing a mesa passivation layer, according to the first embodiment.
Figure 18:
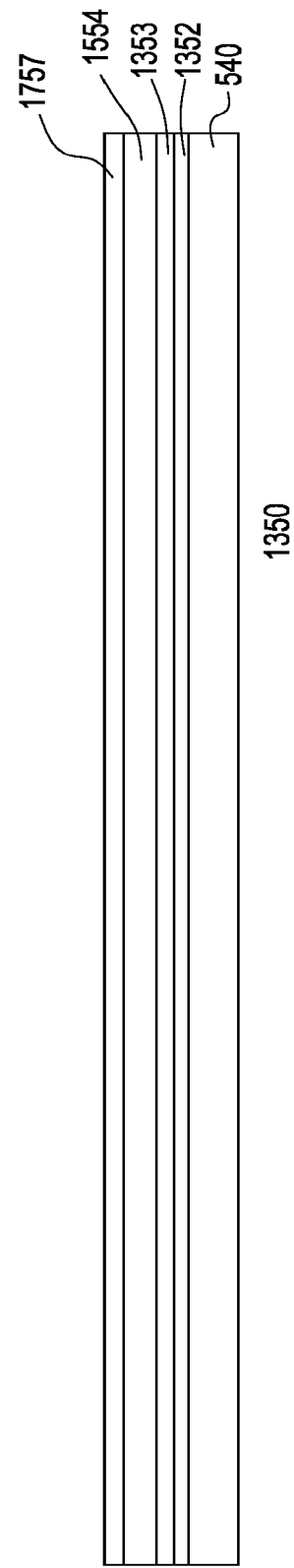
FIG. 18 illustrates a cross-sectional view of an example of the gate contact build area of the semiconductor device of FIG. 14 after providing the mesa passivation layer, according to the first embodiment.

Next, process 1112 of FIG. 12 includes an activity 1213 of providing a mesa passivation layer. FIGS. 17 and 18 illustrate an example of semiconductor device 1350 after providing a mesa passivation layer, according to the first embodiment.

With reference to FIG. 17, as an example, in the device build area of semiconductor device 1350, mesa passivation layer 1757 is deposited onto semiconductor device 1350 over silicon nitride gate dielectric 1554, a-Si layer 1555, and silicon nitride IMD layer 1556. Mesa passivation layer 1757 can comprise silicon nitride. Mesa passivation layer 1757 can be deposited over a-Si layer 1555 to passivate and/or encapsulate the surface of a-Si layer 1555, thereby preventing contamination of the surface of a-Si layer 1555 and lowering leakage currents along the surface of a-Si layer 1555. With reference to FIG. 18, as an example, in the gate contact build area of semiconductor device 1350, mesa passivation layer 1757 can be deposited over silicon nitride gate dielectric 1554.

Mesa passivation layer 1757 can be deposited onto semiconductor device 1350 by way of PECVD. As an example, mesa passivation layer 1757 can be approximately 0.10 µm thick. In the same or different examples, mesa passivation layer 1757 can be deposited via PECVD using an AMAT P5000.

Figure 19:
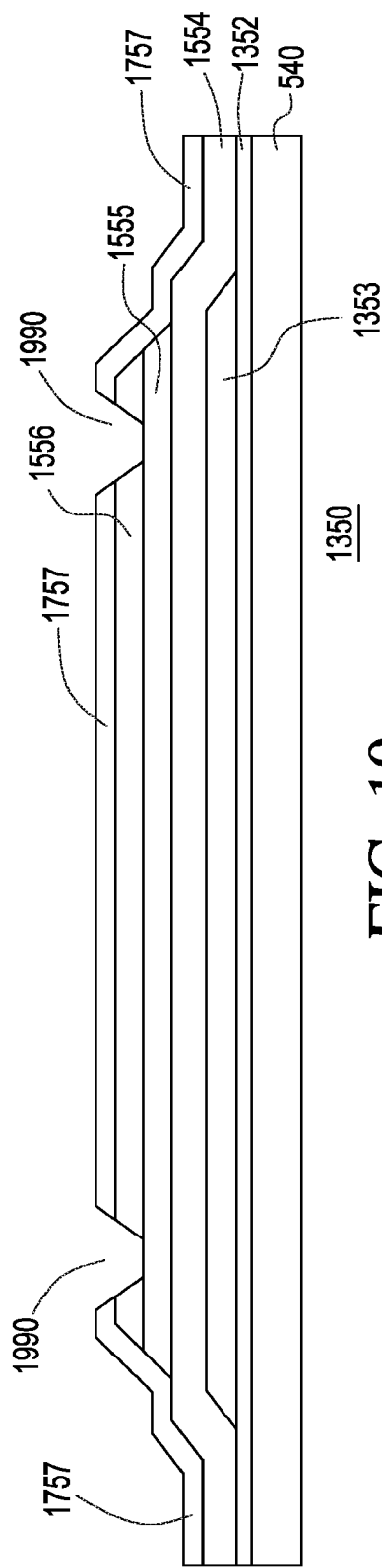
FIG. 19 illustrates a cross-sectional view of an example of the device build area of the semiconductor device of FIG. 13 after conducting one or more post-mesa passivation layer etches, according to the first embodiment.
Figure 20:
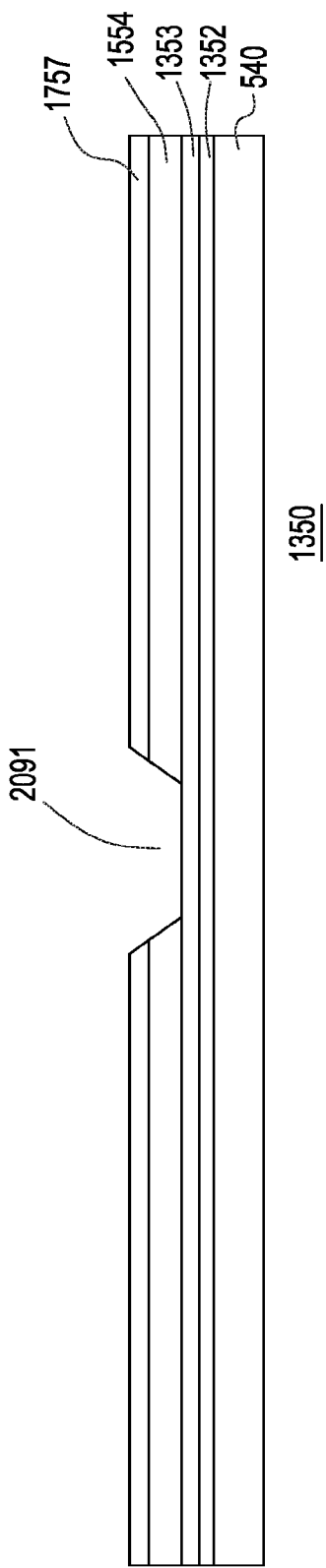
FIG. 20 illustrates a cross-sectional view of an example of the gate contact build area of the semiconductor device of FIG. 14 after conducting one or more post-mesa passivation layer etches, according to the first embodiment.

Subsequently, process 1112 of FIG. 12 includes an activity 1214 of conducting one or more post-mesa passivation layer etches. FIGS. 19 and 20 illustrate cross-sectional views of semiconductor device 1350 after one or more post-mesa passivation layer etches have been conducted. For example, FIG. 20 illustrates semiconductor device 1350 after a contact gate etch has taken place in the gate contact build region of semiconductor device 1350. In the same or different examples, FIG. 19 illustrates semiconductor device 1350 after a contact a-Si etch has taken place in the device build region of semiconductor device 1350.

The contact gate etch of the gate contact build region of semiconductor device 1350 can etch away silicon nitride. For example, the contact gate etch can etch away mesa passivation layer 1757 and silicon nitride gate dielectric 1554. In many examples, the metal gate layer 1353 underneath silicon nitride gate dielectric 1554 functions as an etch stop for the etching process. The contact gate etch of the contact gate build region can be performed in a Tegal 903, manufactured by Tegal Corporation of Petaluma, Calif. After the contact gate etch, gate contact 2091 is formed on semiconductor device 1350. Gate contact 2091 is associated with gate contact area 2981 of FIG. 29.

The contact a-Si etch of the device build region of semiconductor device 1350 can etch away silicon nitride. For example, the contact a-Si etch can etch away mesa passivation layer 1757 and silicon nitride IMD layer 1556. The silicon nitride layers can be etched using a 10:1 BOE. a-Si layer 1555 under silicon nitride layer 1556 can act as an etch stop for the etching process. After the contact a-Si etch, a-Si contacts 1990 are formed on semiconductor device 1350. a-Si contacts 1990 are associated with a-Si contact areas 2980 of FIG. 29. In this embodiment, the contact a-Si etch and the contact gate etch can be separate etches using separate etch masks.

Figure 21:
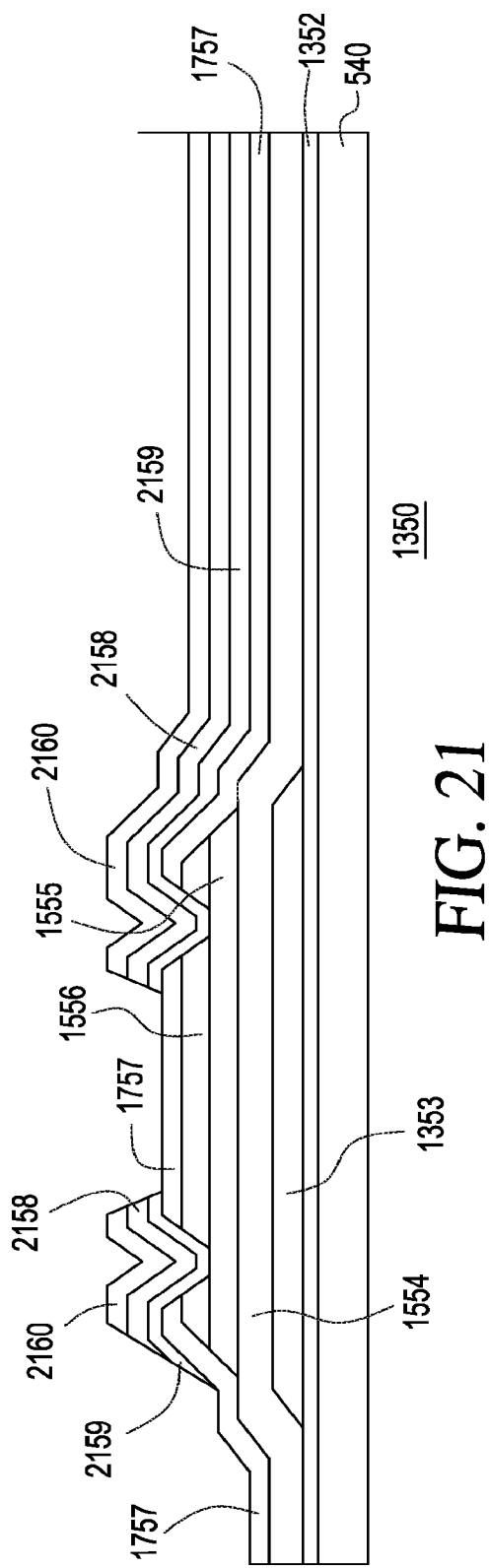
FIG. 21 illustrates a cross-sectional view of an example of the device build area of the semiconductor device of FIG. 13 after providing one or more contact elements, according to the first embodiment.
Figure 22:
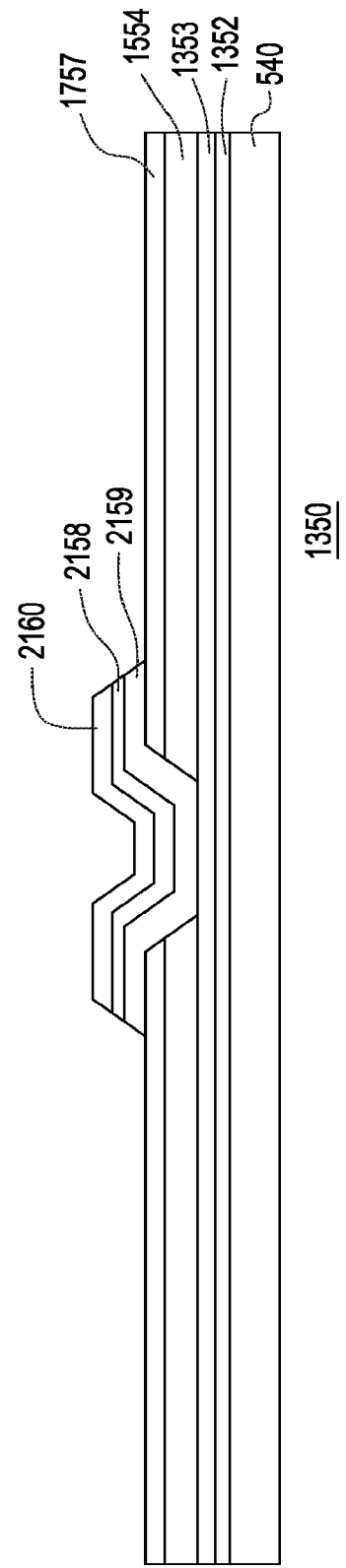
FIG. 22 illustrates a cross-sectional view of an example of the gate contact build area of the semiconductor device of FIG. 14 after providing one or more contact elements, according to the first embodiment.

After activity 1214, process 1112 of FIG. 12 is completed. With reference to FIG. 11, procedure 120 continues with a process 1113 of providing one or more contact elements. FIG. 21 illustrates a cross-sectional view of a device build region of an example of semiconductor device 1350 after process 1113 has been completed. In addition, FIG. 22 illustrates a cross-sectional view of a gate contact build region of an example of semiconductor device 1350 after process 1113 has been completed.

In the example illustrated in FIG. 21, N+ a-Si layer 2159 is provided over portions of mesa passivation layer 1757, a-Si layer 1555, and silicon nitride IMD layer 1556. As illustrated in FIG. 21, diffusion barrier 2158 is provided over N+ a-Si layer 2159, and metal layer 2160 is provided over diffusion barrier 2158. Similarly, in the example of FIG. 22, N+ a-Si layer 2159 is provided over portions of mesa passivation layer 1757, silicon nitride gate dielectric 1554, and gate metal layer 1353. Also shown in FIG. 22, diffusion barrier 2158 is provided over N+ a-Si layer 2159, and metal layer 2160 is provided over diffusion barrier 2158.

N+ a-Si layer 2159 may be provided by way of PECVD. As an example, N+ a-Si layer 2159 can be approximately 0.05 μm thick. In the same or different examples, N+ a-Si layer 2159 can be deposited via PECVD using an AMAT P5000.

As an example, diffusion barrier 2158 can include tantalum (Ta). In the same or different examples, metal layer 2160 can include aluminum (Al). Diffusion barrier 2158 can help prevent movement of atoms from metal layer 2160, such as, for example, Al atoms, from diffusing into N+ a-Si layer 2159, and subsequently a-Si layer 1555. Diffusion barrier 2158 and metal layer 2160 can be deposited over N+ a-Si layer 2159 by way of sputtering. In some examples, diffusion barrier 2158 and metal layer 2160 can be deposited using a KDF 744.

After, N+ a-Si layer 2159, diffusion barrier 2158, and metal layer 2160 have been deposited onto semiconductor device 1350, the three layers are etched. As an example, the three layers can be etched using an AMAT 8330. In some examples, N+ a-Si layer 2159, diffusion barrier 2158, and metal layer 2160 are etched using a single recipe for all three of the layers. As an example, the N+ a-Si layer 2159, diffusion barrier 2158, and metal layer 2160 are etched using boron trichloride ($BCl_3$) with a flow rate of approximately 140 sccm (standard cubic centimeters per minute) and chlorine gas ($Cl_2$) with a flow rate of approximately 10 sccm at a pressure of approximately 20 mTorr for 1 minute and 45 seconds. Next, the $Cl_2$ is increased to 30 sccm, while the pressure is dropped to 10 mTorr for 15 minutes. Next, the $BCl_3$ rate is decreased to 30 sccm, and the pressure is increased to 15 mTorr. Finally, the $BCl_3$ and the $Cl_2$ flow rates are brought to zero, and oxygen ($O_2$) is brought in at 50 sccm with a pressure of 50 mTorr for 60 minutes.

In various embodiments, procedure 120 can include a process 1198 of providing a base dielectrical material. The base dielectric material can provide a uniform surface (e.g., a wetting layer) for the spin-on dielectric material (e.g., dielectric layer 2461 (FIG. 24)). In some examples, the base dielectric material can include silicon oxide or silicon nitride (e.g., base dielectric material 2499). In many examples, the base dielectric material can be provided using a process similar or identical to the process used to provide the second dielectric material (i.e., process 1117), as described below. In other embodiments, procedure 120 does not include process 1198 or providing a base dielectric material.

Subsequently, procedure 120 includes a process 1114 of providing a first dielectric material. The first dielectric material can be provided over the one or more contact elements of process 1113. In some examples, the first dielectric material can be an organic siloxane-based dielectric material, organosiloxane dielectric material, and/or siloxane-based dielectric material. In various embodiments, the first dielectric material can be organic. Using an organic siloxane-based dielectric material can allow for thicker films and more flexible films than with a non-organic siloxane-based dielectric material. In some examples, the first dielectric material can be used as an interlayer dielectric. In the other examples, the first dielectric material can be used as an intralayer dielectric.

Table 1 illustrates properties of an example of a dielectric material that can be used as the first dielectric material in process 1114, according to an embodiment.

TABLE 1

| Properties | Dielectric Material |
|---|---|
| Cure temperature | ~400° C. (when deposited over low temperature polysilicon) |
| | ~350° C. (when deposited over amorphous silicon (a-Si)) |
| | <200° C. (when deposited over a flexible substrate) |
| Film Thickness | 1.5 μm to 3.5 μm |
| Transmittance | >95% |
| Planarization | >95% |
| Resistance to plasma induced damage | Fluorine-based plasma (e.g., Sulfur hexaflourine ($SF_6$), carbon tetra fluorine ($CF_4$), trifluoromethane ($CHF_3$), $O_2$ plasma used for removing photoresist, and ashing |
| Adhesion | Aluminum (Al), chromium (Cr), indium tin oxide (ITO), silicon nitride (SiN), organic layers |
| Outgassing | Low (less than typical CVD chamber pressures) |
| Moisture uptake | Low moisture uptake |
| Dispense tool | Spin or slot die coaters, screen printers, spray coating |

As used in Table 1, film thickness refers to the desired thickness of the dielectric material that displays the other properties in the table. Transmittance refers to the percentage of light that is transmitted through the dielectric material. Planarization refers to the degree of planarization (DOP) of the dielectric material. Resistance to plasma induced damage indicates the plasmas that will not damage this film. Adhesion means the dielectric material can be coupled to at least these other materials. Outgassing can refer to outgassing pressure of the dielectric material or the rate at which the dielectric material outgases. Moisture uptake can refer to the rate at which moisture is absorbed by the dielectric material. Dispense tools refers to equipment that can be used to apply the dielectric material.

Table 2 illustrates properties of a second example of a dielectric material that can be used as the first dielectric material in process 1114, according to an embodiment.

TABLE 2

| Properties | Dielectric Material |
|---|---|
| Film Thickness | 1 μm to 4 μm |
| Cure temperature | ~180° C. |
| Etch Chemistry | Standard plasma etch chemistries |
| Etch Rate | >0.25 μm per minute |
| Feature Size | <5 μm |
| Dielectric Constant (k) | <4.0 |
| Breakdown Voltage | >5 megavolts per centimeter (MV/cm) |
| Heat Resistance | ≥250° C. |

TABLE 2-continued

| Properties | Dielectric Material |
| --- | --- |
| Adhesion | Al, ITO, molybdenum (Mo), photoresist |
| Moisture Uptake | <0.2 wt % over 2 hours |
| Planarization | >95% |
| Outgassing | No |
| Transparency | >95% |

As used in Table 2, etch chemistries refers to etch chemistries that can be used to etch the dielectric material. Etch rate is the minimum etch rate of the dielectric material when using the etch chemistries. Feature size refers to the smallest size of an element or feature formed with the dielectric material. Breakdown voltage is the voltage per length at which the dielectric material begins acting as a conductor. Heat resistance is the lowest temperature that the material can withstand before becoming unstable.

Figure 23:
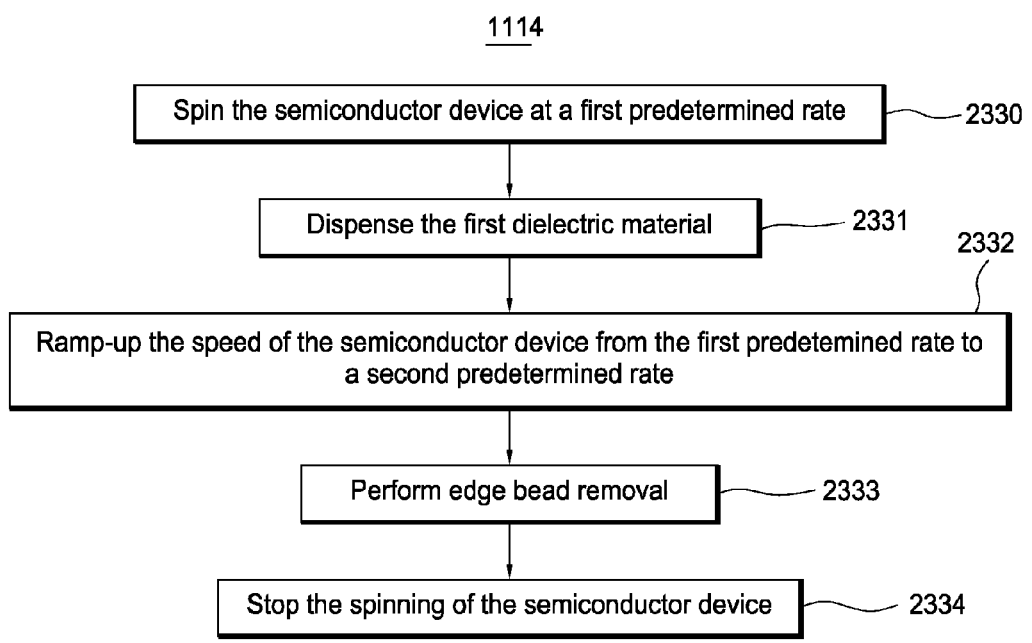
FIG. 23 illustrates an example of a process of providing a first dielectric material, according to the first embodiment.

FIG. 23 illustrates an example of process 1114 of providing a first dielectric material. In various embodiments, the first dielectric material can be a spin-on-dielectric. Accordingly, in these examples, the dielectric can be applied to the semiconductor device by spin-coating the first dielectric material over the first metal layer and various silicon nitride layers. In various embodiments, the application of the first dielectric material can be performed in a Rite Track 8600 available from Rite Track, Inc., of West Chester, Ohio.

Referring to FIG. 23, process 1114 can include an activity 2330 of spinning the semiconductor device at a first predetermined rate. In some examples, the first predetermined spin rate is between approximately 500 rpm and approximately 2000 rpm. In same or different embodiment, the first predetermined rate is approximately 1000 rpm.

Subsequently, process 1114 can include an activity 2331 of dispensing the first dielectric material. In some examples, the first dielectric material is dispensed over the substrate while the substrate is spinning at the first predetermined rate. In some examples, the first dielectric material can be dispensed using a syringe. If the substrate is a six inch diameter wafer, approximately 4 mL (milliliters) can be dispensed over the semiconductor device. In some examples, the pressure in the tip of the syringe during dispensing can be approximately 15 kPa. In the same or different embodiment, after the syringe dispenses the first dielectric material, the syringe has suck back pressure of approximately 1 kPa. The suck back pressure of the syringe prevents dripping additional amounts of the first dielectric material from the syringe after the dispensing process is complete. For a 6-in wafer, the dispensing process takes approximately 3 seconds. The semiconductor device is spun at the first predetermined rate until activity 2331 is complete.

In various embodiments, a dynamic dispensing process is used. That is, the substrate is spinning while the first dielectric material is dispensed. In some examples, the first dielectric material is dispensed at the center of the substrate. In other examples, at the beginning of the dispensing process, the syringe is located over the center of the substrate and moves from the center of the substrate to the edge of the substrate at a constant rate of approximately thirty to approximately sixty millimeters per second while the substrate is spinning. In other embodiments, a static dispensing process is used. That is, the substrate is not spun during the dispensing process.

Next, process 1114 includes an activity 2332 of ramping-up the speed of the semiconductor device from the first predetermined rate to a second predetermined rate. In some examples, the second predetermined spin rate is between approximately 2000 rpm and approximately 4000 rpm. In the same or different embodiment, the second predetermined rate is approximately 2600 rpm. Spinning the semiconductor device at the second predetermined rate of approximately 2600 rpm for approximately thirty seconds can distribute the first dielectric material with a thickness of approximately two μm over the surface of the semiconductor device. Different thicknesses of the first dielectric material can be achieved by using different second predetermined rates.

Figure 30:
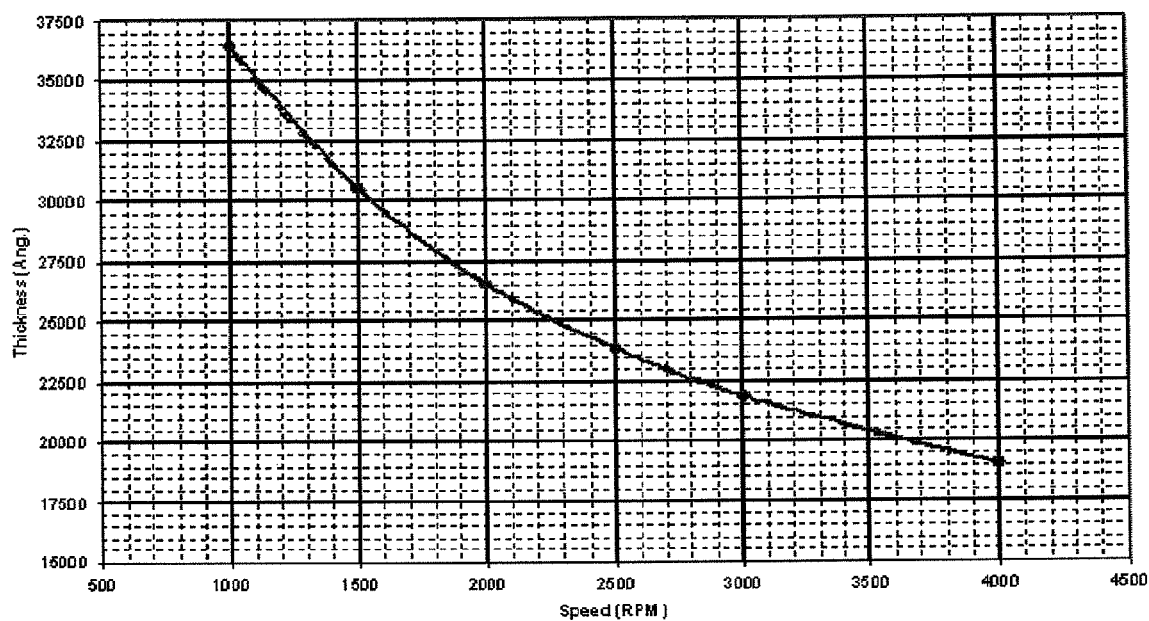
FIG. 30 illustrates a graph of thickness of a dielectric material versus spin rate of a substrate.

FIG. 30 is an illustration of thickness of the first dielectric material versus the spin rate (i.e., speed) of the semiconductor material.

Process 1114 can further include an activity 2333 of performing edge bead removal. In some examples, during activities 2331 and 2332, the first dielectric material flows outward due to the centrifugal force toward the edge of the substrate and creates a ridge (i.e., the edge bead) on the top side edge of the semiconductor device. The edge bead, when dried, could flake off and increase defects of the semiconductor device and/or damage the manufacturing equipment. Accordingly, the edge bead is removed in activity 2333. In some examples, the equipment used in activities 2331 and 2332 can include an edge bead removal device. In some examples, a solvent is sprayed on the edge bead to remove the first dielectric material around the edge of the substrate. In some examples, while the semiconductor device is spun at a third predetermined rate, a solvent is sprayed over, for example, approximately five to approximately six millimeters inside the edge of the substrate. In some examples, removing the first dielectric material from the edges of the substrate also helps to ensure that when a second dielectric material is provided over the first dielectric material (process 1117 of FIG. 11), the edges of the first dielectric material are capped by a second dielectric material.

In some examples, cyclohexanone, propylene glycol monomethyl ether acetate (PGMEA), or other edge bead removing solvents can be used. In some examples, the semiconductor device is rotated at a third predetermined rate of approximately 1000 rpm during the edge bead removal process. In some examples, the semiconductor device is spun at the third predetermined rate for approximately thirty seconds, and solvent is sprayed on the bead edge during this time.

Subsequently, process 1114 continues with an activity 2334 of stopping the spinning of the semiconductor device. After the spinning of the semiconductor device is stopped, process 1114 is complete.

Referring back to FIG. 11, procedure 120 includes a process 1115 of baking the semiconductor device. In some examples, baking the semiconductor device includes baking the first dielectric material of process 1114, the base dielectric material of process 1198, the one or more contact elements of process 1113, the one or more first semiconductor elements of process 1112, and the substrate of procedure 110. One of the purposes of the bake is to cause evaporation of the solvents from the edge bead process. Baking the semiconductor device can also increase planarization, decrease film defects, and cross-link the first dielectric material.

In various embodiments, the baking of the semiconductor device is performed using a two bake sequence. The baking process can be performed at atmospheric pressure using a hot plate. Process 1115 can be performed, for example, in a Rite Track 8800.

The first bake is a bake for approximately sixty seconds at approximately 160° C. In an alternative example, the first bake can be an approximately sixty second bake at approximately 150° C. After the first bake is complete, in some examples, the semiconductor device is allowed to cool for approximately thirty seconds before the second bake. The semiconductor device can be allowed to cool at room temperature (and not using a chill plate). The semiconductor device is allowed to cool, in these examples, because the handling system uses polytetrafluoroethylene (e.g., Teflon® material from E.I. du Pont de Nemours and Company of Wilmington, Del.) coated chucks to handle the semiconductor device. Placing a hot semiconductor device on the polytetrafluoroethylene coated chuck can damage the chuck. If other equipment is used, the cooling process can possibly be skipped.

After letting the semiconductor device cool, the semiconductor device can be baked for a second time on a hot plate. In some embodiments, the second bake can be for approximately sixty seconds at a temperature greater than approximately 160° C. because 160° C. is the boiling point of PGMEA. For example, if the first bake was at the 160° C., the second bake can be for approximately sixty seconds at approximately 170° C. If the first bake was at the 150° C., the second bake can be for approximately sixty seconds at approximately 200° C. After the second bake is complete, the semiconductor device can be cooled again for thirty seconds. In other embodiments, other sequences of bakes can be performed.

After the baking is complete, the next process in procedure 120 is a process 1116 of curing the first dielectric material. Curing of the first dielectric material can improve the cross-linking of the first dielectric material. In some examples, the curing can be performed in a convection oven in a nitrogen atmosphere at atmospheric pressure (i.e., approximately one atmosphere).

In various examples, the semiconductor device can be placed in the oven. Afterwards, the temperature in the oven can be ramped-up to approximately 200° C., and the semiconductor device can be baked for approximately one hour at approximately 200° C. The temperature is ramped-up a rate of approximately 1-2° C. per minute to minimize outgassing of the first dielectric material of process 1114. After the bake is complete, the temperature is slowly ramped down (e.g., 1-2° C. per minute) to room temperature.

In another embodiment, a baking procedure with five separate bakes can be used. The first bake can be a bake at approximately 60° C. for approximately ten minutes. The ramp-up time to approximately 60° C. from room temperature is approximately ten minutes. After baking at approximately 60° C., the temperature is ramped-up over approximately thirty-two minutes to approximately 160° C. The semiconductor device is baked for approximately thirty-five minutes at approximately 160° C.

The temperature of the convection oven is then increased to approximately 180° C. over approximately ten minutes after the 160° C. bake. The semiconductor device is baked for approximately twenty minutes at approximately 180° C.

After baking at 180° C., the temperature is ramped-up over approximately fifty minutes to approximately 200° C. The semiconductor device is baked for approximately sixty minutes at approximately 200° C. Finally, in this bake procedure, the temperature in the oven is ramped-down to approximately 60° C. over approximately seventy minutes. The semiconductor device is baked for approximately ten minutes at approximately 60° C. After baking is complete, the semiconductor device is allowed to cool to approximately room temperature before proceeding with procedure 120 of FIG. 11. The baking of the semiconductor device can help anneal the one or more contact elements.

Subsequently, procedure 120 includes a process 1117 of providing a second dielectric material. In some examples, providing the second dielectric material can include depositing the second dielectric material over the organosiloxane dielectric layer (i.e., the first dielectric material of process 1114). In some examples, the second dielectric material can comprise silicon nitride. In the same or different examples, the second dielectric material can include silicon oxynitride ($SiO_xN_y$), silicon oxide, and/or silicon dioxide ($SiO_2$). In some examples, a low temperature PECVD process can be used to deposit the second dielectric material. In some examples, as part of providing the second dielectric material, the first dielectric material is capped by the second dielectric material. In some examples, the edges of the first dielectric material can be capped by the second dielectric material so the first dielectric material is not exposed to any subsequent oxygen ($O_2$) plasma ashings. Oxygen plasma ashings can degrade the first dielectric material in some examples.

The second dielectric material can be deposited with a thickness of approximately 0.1 μm to approximately 0.2 μm. The second dielectric material can be deposited to protect the first dielectric material from later etches.

The next process in procedure 120 is a process 1118 of providing a mask over the second dielectric material. The mask applied in process 1118 can be an etch mask for an etching activity of process 1119 of FIG. 11.

In some examples, process 1118 can include applying a patterned photoresist over the siloxane-based dielectric layer (i.e., the first dielectric material of process 1114) or patterning a mask over the organic siloxane-based dielectric (i.e., the first dielectric material of process 1114). Similarly, process 1118 can include providing a patterned mask over the organosiloxane dielectric layer (i.e., the first dielectric material of process 1114).

In some examples, the mask covers one or more portions of the first dielectric material and the second dielectric material that are not to be etched. The mask can be provided with a thickness such that the mask is not etched through during the etching process of process 1119 of FIG. 11. In some examples, the mask can have a thickness of approximately 3.5 μm or approximately 2.5 μm to approximately 5.0 μm.

In some examples, the mask comprises photoresist. In some examples, the photoresist can be AZ Electronic Materials MiR 900 Photoresist, manufactured by AZ Materials of Luxembourg, Luxembourg. In some examples, the photoresist is coated over the second dielectric material using the Rite Track 8800. For example, the semiconductor device can be vapor primed and spin-coated with the mask (e.g., the photoresist). After coating the semiconductor device, the semiconductor device is baked at approximately 105° C. for approximately sixty seconds.

Next, the semiconductor device is aligned to the correct position with a template and exposed to UV (ultraviolet) light to transfer the mask image from the template to the mask. After exposing the mask, the semiconductor device is baked for approximately ninety seconds at approximately 110° C. The mask is then developed using an approximately ninety second puddle with standard development chemicals to remove the portions of the photoresist that were not exposed to the UV light.

After the development is completed, the last portion of providing the mask over the second dielectric material is performing a photoresist reflow process on the mask. Photoresist reflow is the process of heating the mask after the photoresist has been developed to cause the photoresist to become at least semi-liquid and flow.

In some examples, the semiconductor device is baked at approximately 140° C. for approximately sixty seconds. This photoresist reflow process will decrease the sharpness of the edges of the mask, and thus, when etched in process 1119 of FIG. 11, the vias in the first dielectric and the second dielectric will have sloped sides. In some examples, the sloped sizes are at an angle of approximately thirty degrees from horizontal.

Next, procedure 120 includes a process 1119 of etching the base dielectric material, the first dielectric material, and the second dielectric material. The base dielectric material, the first dielectric material, and the second dielectric material are etched to create vias in the base dielectric material, the first dielectric material, and the second dielectric material.

In some examples, the base dielectric material, the first dielectric material, and the second dielectric material are etched in the same process using the same etch mask. In other examples, the first dielectric material is etched in a first process, and the second dielectric is etched in a second process, and the base dielectric is etched in a third process.

In these other examples, a mask can be applied to the base dielectric material; the base dielectric material can be etched; and the mask can be removed before the first dielectric material is provided in process 1114 of FIG. 11. Subsequently, a mask can be applied to the first dielectric material; the first dielectric material can be etched; and the mask can be removed before the second dielectric material is provided in process 1118 of FIG. 11. Then, a mask can be applied to the second dielectric material, and the second dielectric material can be etched. In another example, the second dielectric material can be etched using the mask of process 1118; the mask can be removed; and the patterned second dielectric material can be used as the mask for patterning the first dielectric material.

In many embodiments, the base dielectric material, the first dielectric material, and the second dielectric material are plasma etched. In the same of different embodiments, the base dielectric material, the first dielectric material, and the second dielectric material are reactive ion etched (RIE). In some examples, the base dielectric material, the first dielectric material, and the second dielectric material are etched with a fluorine-based etchant. In some examples, the etchant can be trifluoromethane ($CHF_3$), sulfur hexafluoride ($SF_6$), or other fluorine-based etchants.

In some examples where there is no base dielectric material (i.e., process 1198 is skipped), the first material can be the organosiloxane dielectric material described previously, and the second material can be silicon nitride. In these examples, the first dielectric material and the second dielectric material can be RIE etched with sulfur hexafluoride ($SF_6$) for approximately four minutes. If sulfur hexafluoride is used as the etchant, the etching can be performed in a plasma chamber with a 1:2 ratio of sulfur hexafluoride to oxygen ($O_2$).

The etch rate of the sulfur hexafluoride for the first dielectric material and the second dielectric material are approximately the same (i.e., approximately 0.5 µm per minute). The etch rate of the second dielectric material, however, is marginally greater than the first dielectric material. In some example, the pressure in the plasma chamber during etching is approximately 50 mTorr to approximately 400 mTorr. The RIE etch can be performed in a Tegal 901, manufactured by Tegal Corporation of Petaluma, Calif.

The second dielectric material can be etched before the first dielectric material; the first dielectric material can be etched before the base dielectric material. In many examples, the metal layer underneath the base dielectric material functions as an etch stop for the etching process. If sulfur hexafluoride is used as the etchant, the metal layer can be aluminum. In this embodiment, the metal layer cannot be molybdenum or tantalum because sulfur hexafluoride etches these two metals. In a different embodiment, the metal layer can include molybdenum and/or tantalum if the etch for the overlying second dielectric layer is a timed etch.

Figure 24:
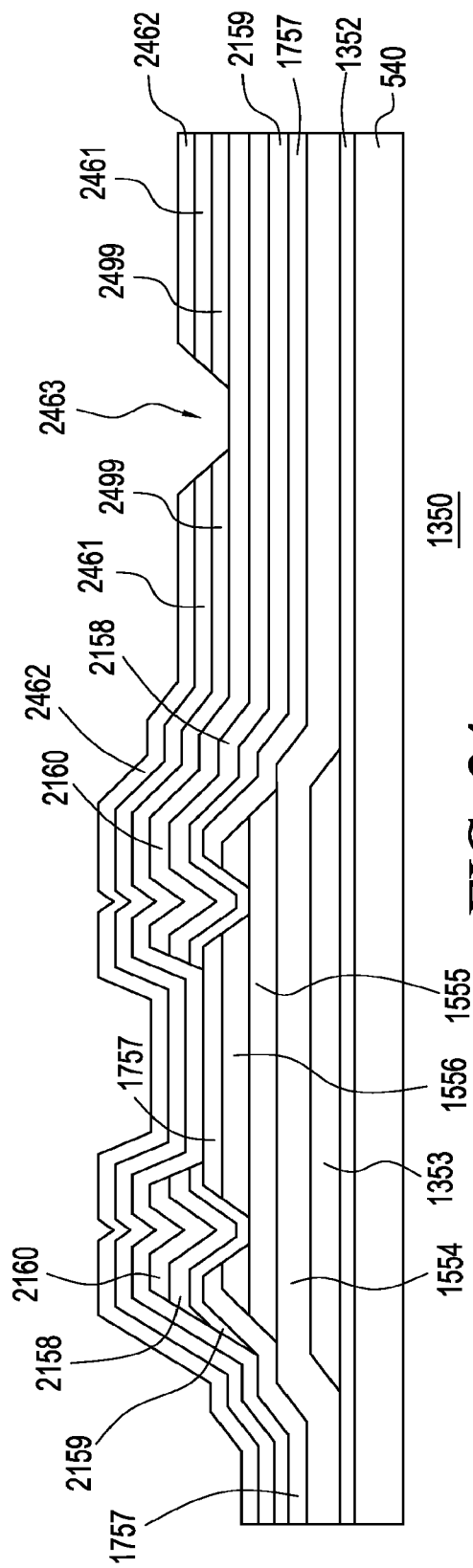
FIG. 24 illustrates a cross-sectional view of an example of the device build area of the semiconductor device of FIG. 13 after etching a base dielectric material, a first dielectric material, and a second dielectric material, according to the first embodiment.

A buffered oxide etch (BOE) and chlorine based etchants cannot be used in some examples because they do not etch the first dielectric material when it comprises an organosiloxane dielectric material. FIG. 24 illustrates a cross-sectional view of the device build area of an example of semiconductor device 1350 after etching etch base dielectric material 2499, first dielectric material 2461 and second dielectric material 2462. After process 1119 in FIG. 11, semiconductor device 1350 can include vias 2463, as shown in FIG. 24. Vias 2463 are associated with via area 2982 of FIG. 29. The mask over second dielectric layer 2462 is not shown in FIG. 24

Referring again to FIG. 11, the next process in procedure 120 is a process 1120 of removing the mask. In some examples, the mask is removed by ashing the mask (e.g., the photoresist) at a temperature below 110° C. If the mask is ashed at a temperature above 110° C., cracking can occur in the first dielectric material. Accordingly, in some examples, ashing of the mask is performed at a temperature in the range of approximately 70° C. to approximately 90° C. In the same or different example, the ashing of the mask is performed at a temperature in the range of approximately 77° C. to approximately 84° C.

The ashing can be performed at a pressure of no greater than approximately 300 mTorr. Oxygen ($O_2$) can flow through in the chamber during the ashing process at a rate of approximately 50 sccm. In various examples, the ashing procedure can be performed in a Tegal 901. After ashing the mask, the semiconductor device can be rinsed with deionized water and spin dried. In some examples, the rinsing can be performed in a quick dump rinser, and the drying can be performed in a spin rinse dryer.

In other examples, a wet strip can be used to remove the photoresist. In some embodiments, an N-methylpyrrolidinone (NMP) based stripper can be used.

The next process in procedure 120 of FIG. 21 is a process 1121 of providing one or more second semiconductor elements. Examples of one or more second semiconductor elements can include a second metal layer, an indium tin oxide (ITO) layer, and a silicon nitride layer.

Figure 25:
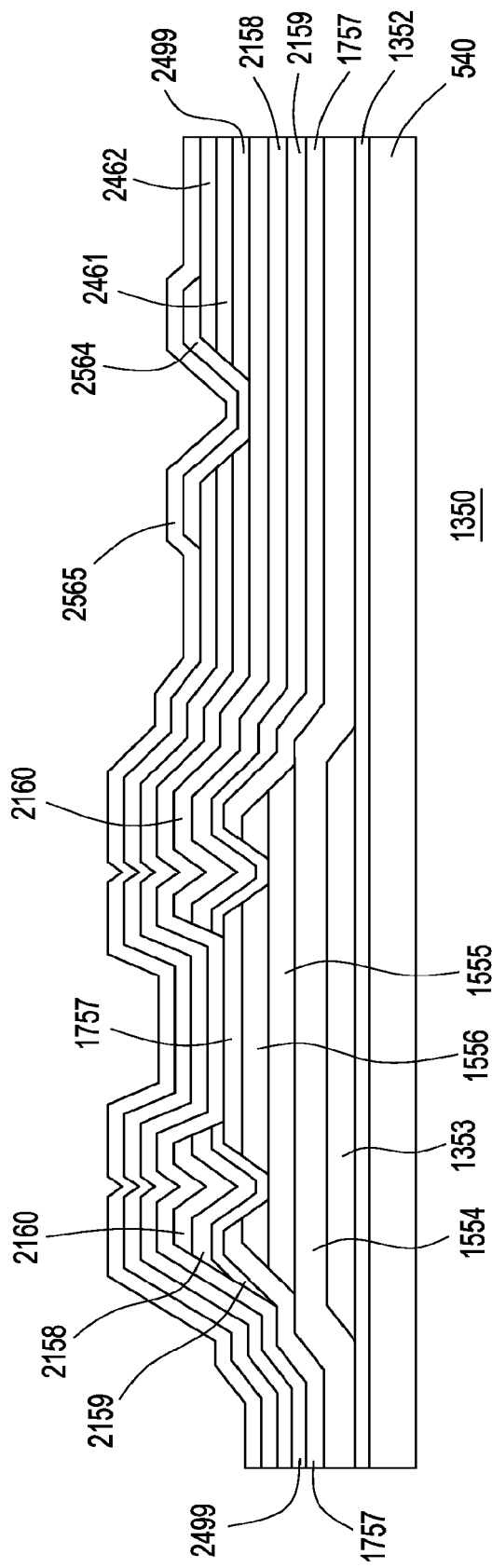
FIG. 25 illustrates a cross-sectional view of an example of the device build area of the semiconductor device of FIG. 13 after providing a second metal layer and an ITO layer, according to the first embodiment.

As an example, FIG. 25 illustrates a cross-sectional view of the device build area of an example of semiconductor device 1350 after providing a second metal layer 2564 and an ITO layer 2565. Second metal layer 2564 can be deposited over second dielectric material 2462 and at least partially in vias 2463 (FIG. 24). Second metal layer 2564 can comprise molybdenum and can be approximately 0.15 µm thick. In some examples, second metal layer 2564 can be deposited by sputtering using a KDF 744.

ITO layer 2565 can be deposited over second metal layer 2564. ITO layer 2565 can comprise indium tin oxide and can be approximately 0.05 µm thick. In some examples, ITO layer can be deposited by sputtering using a KDF 744.

In some examples, second metal layer 2564 is pattern etched. Then ITO layer 2565 can be deposited onto second metal layer 2564 and then pattern etched. As an example, second metal layer 2564 and ITO layer 2565 can be etched using an AMAT 8330.

Figure 26:
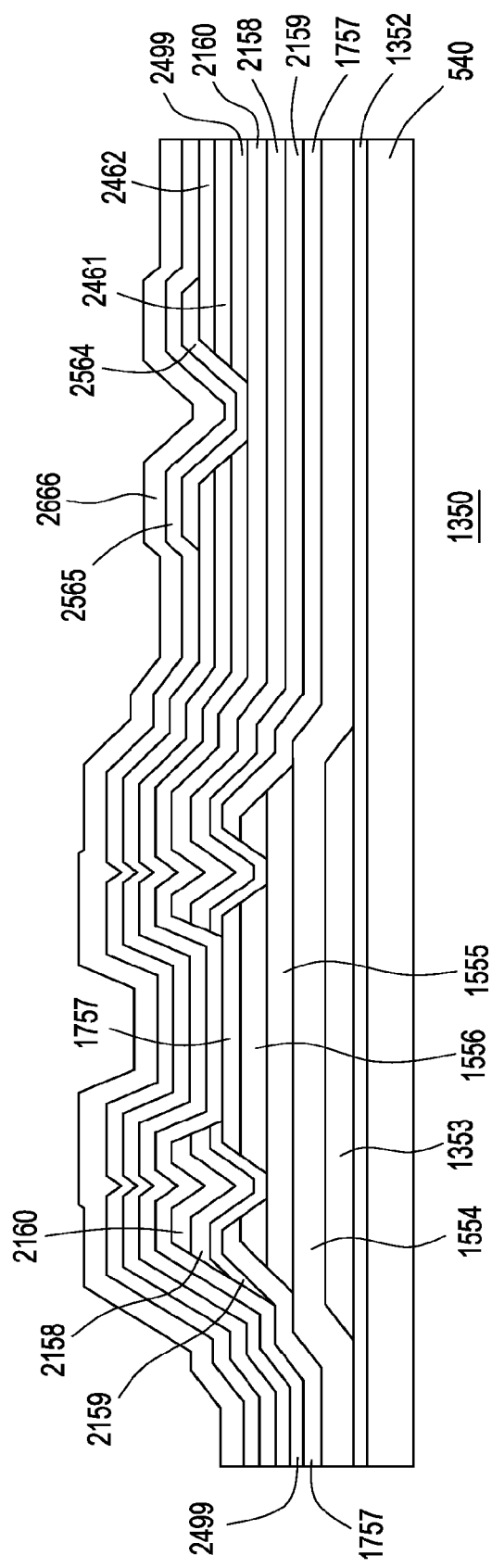
FIG. 26 illustrates a cross-sectional view of an example of the device build area of the semiconductor device of FIG. 13 after providing a silicon nitride layer, according to the first embodiment.

FIG. 26 illustrates a cross-sectional view of the device build area of an example of semiconductor device 350 after providing a silicon nitride layer 2666. Silicon nitride layer 2666 can be deposited over ITO layer 2565 and can be approximately 0.10 µm thick. In some examples, silicon nitride layer 2666 can be deposited via PECVD using an AMAT P5000. In the same or other examples, silicon nitride layer 2666 can be etched using a Tegal 901, with ITO layer 2565 being the stop layer.

After process 1121, procedure 120 is complete. With reference to FIG. 1, the next procedure of method 100 is a procedure 130 of removing the flexible substrate, including the semiconductor elements coupled to the flexible substrate, from the carrier substrate. In some examples, the flexible substrate can be removed from the carrier substrate by peeling the flexible substrate from the carrier substrate by hand.

Figure 27:
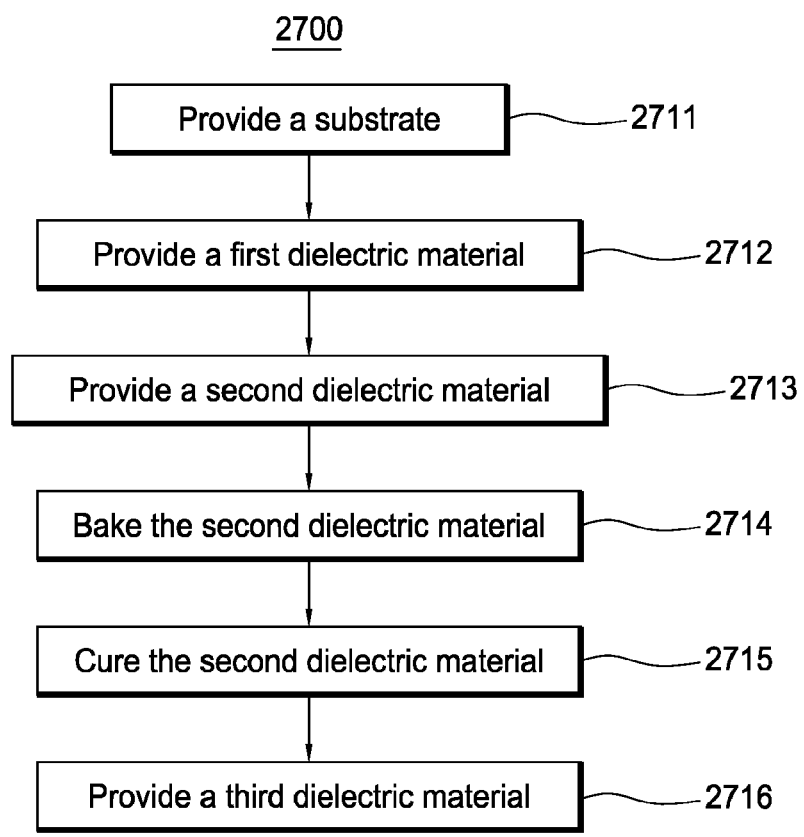
FIG. 27 illustrates an example of a method of planarizing a flexible substrate, according to a second embodiment.

Turning to another embodiment, FIG. 27 illustrates an example of a method 2700 of planarizing a flexible substrate. In the same or different embodiments, method 2700 can be considered a method of etching an organosiloxane dielectric material. Method 2700 can also be considered a method of etching an organic siloxane-based dielectric or a method of etching a siloxane-based dielectric material. Method 2700 is merely exemplary and is not limited to the embodiments presented herein. Method 2700 can be employed in many different embodiments or examples not specifically depicted or described herein.

Referring to FIG. 27, method 2700 includes a procedure 2711 of providing a substrate. Procedure 2711 can be similar or identical to process 211 of FIG. 2. The substrate can be similar or identical to substrate 450 of FIG. 4. In yet other embodiments, Procedure 2711 can be similar or identical to method 110 of FIG. 1, and the substrate can be similar or identical to substrate 450, which can be a portion of flexible substrate assembly 540.

Method 2700 can continue with a procedure 2712 of providing a first dielectric material. In some examples, the first dielectric material can be similar or identical to second dielectric material 2462 of FIG. 24 and process 1117 of FIG. 11. For example, second dielectric material 2462 can comprise a silicon nitride layer with a thickness of approximately 0.1 µm to approximately 0.2 µm.

The next procedure in method 2700 is a procedure 2713 of providing a second dielectric material. The second dielectric material can be similar or identical to the first dielectric material 2461 of FIG. 24. Procedure 2713 can be similar or identical to process 1114 of FIG. 1.

Method 2700 continues with a procedure 2714 of baking the second dielectric material. In some examples, procedure 2714 can be similar or identical to process 1115 of FIG. 11.

Subsequently, method 2700 includes a procedure 2715 of curing the second dielectric material. In some examples, procedure 2715 can be similar or identical to process 1116 of FIG. 11.

In other examples, a different baking procedure with five separate bakes in a convection oven can be used. The first bake can be a bake at approximately 40° C. for approximately ten minutes. The ramp-up time from room temperature to approximately 40° C. is approximately two minutes. After baking at 40° C., the temperature is ramped-up over approximately thirty-two minutes to approximately 160° C. Then, the flexible substrate is baked for approximately thirty-five minutes at approximately 160° C.

The temperature of the convection oven is then increased to approximately 180° C. over approximately ten minutes after the 160° C. bake. The flexible substrate is baked for approximately twenty minutes at approximately 180° C.

After baking at 180° C., the temperature is ramped-up over approximately fifty minutes to approximately 230° C. Alternatively, the temperature is ramped-up at approximately 2° C. per minute to approximately 230° C. The flexible substrate is baked for approximately fifteen hours at approximately 230° C.

Finally, in this bake procedure, the temperature in the oven is ramped-down to approximately 60° C. over approximately eighty-five minutes. The flexible substrate is baked for approximately ten minutes at approximately 60° C. After baking is complete, the flexible substrate is allowed to cool to approximately room temperature before proceeding with method 2700 of FIG. 27.

Method 2700 continues with a procedure 2716 of providing a third dielectric material. In some examples, the third dielectric material can be deposited with a thickness of approximately 0.2 µm to approximately 0.4 µm. In some examples, the third dielectric material can be an approximately 0.3 µm thick layer of silicon nitride. After depositing the third dielectric material, the flexible substrate can be in-situ baked for approximately five minutes at approximately 180° C. In some examples, the third dielectric material can be similar or identical to nitride passivation layer 1352 of FIG. 13.

Figure 28:
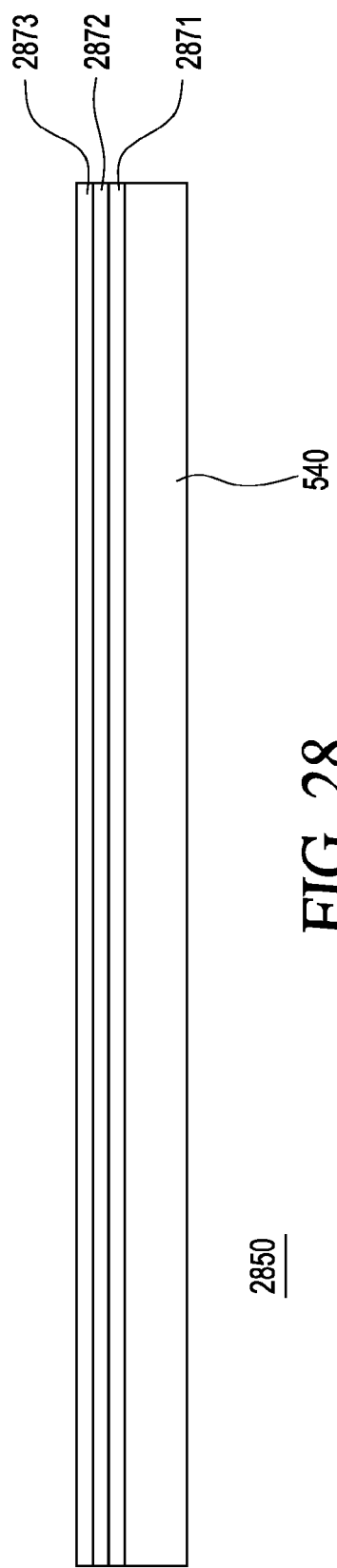
FIG. 28 illustrates a cross-sectional view of an example of a semiconductor device according to the method of FIG. 27, according to the second embodiment.

FIG. 28 illustrates an example of a semiconductor device 2850 after providing the third dielectric material, according to the second embodiment. In these examples, first dielectric material 2871 is provided over flexible substrate assembly 540. Second dielectric material 2872 is provided over first dielectric material 2871, and third dielectric material 2873 is provided over second dielectric material 2872.

After providing the third dielectric layer, method 2700 is complete. The resulting semiconductor device (2850 of FIG. 28) can be used as the flexible substrate provided in procedure 110 of method 100.

Although the invention has been described with reference to specific embodiments, it will be understood by those skilled in the art that various changes can be made without departing from the spirit or scope of the invention. Accordingly, the disclosure of embodiments is intended to be illustrative of the scope of the invention and is not intended to be limiting. It is intended that the scope of the invention shall be limited only to the extent required by the appended claims. To one of ordinary skill in the art, it will be readily apparent that the semiconductor device and its methods of providing the semiconductor device discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of providing a semiconductor device, the method comprising:
providing a carrier substrate;
providing a flexible substrate, wherein the flexible substrate is planarized;
providing a protective template;
attaching a protective material to the flexible substrate;
coupling the protective template to the flexible substrate such that the protective material is at least partially located between the protective template and the flexible substrate;
after coupling the protective template to the flexible substrate, coupling the carrier substrate to the flexible substrate with an adhesive having a bonding force;
after coupling the carrier substrate to the flexible substrate, depositing a gate metal layer over the flexible substrate;
depositing one or more silicon comprising layers over the gate metal layer, wherein a temperature of the depositing the one or more silicon comprising layers reaches at least 180° C.;
depositing one or more contact elements over the one or more silicon comprising layers, wherein the one or more contact elements comprises a diffusion barrier;
depositing a first dielectric material over the one or more contact elements, wherein the first dielectric material comprises an organic siloxane-based dielectric material;
depositing a second dielectric material over the first dielectric material, wherein the second dielectric material comprises silicon nitride;
baking the first dielectric material, the second dielectric material, the flexible substrate, the carrier substrate, the gate metal layer, the one or more silicon comprising layers, and the one or more contact elements, wherein the temperature of the baking reaches at least 200° C.; and
after the baking and while the adhesive is bonding the carrier substrate to the flexible substrate with the bonding force, decoupling the flexible substrate from the carrier substrate, wherein the decoupling consists of peeling the flexible substrate from the carrier substrate.

2. The method of claim 1, wherein:
the one or more silicon comprising layers comprises an amorphous silicon layer.

3. The method of claim 2, wherein:
the one or more silicon comprising layers further comprises a silicon nitride gate dielectric layer and a silicon nitride intermetal dielectric layer.

4. The method of claim 3, further comprising:
before decoupling the flexible substrate from the carrier substrate;
etching the silicon nitride intermetal dielectric layer, the amorphous silicon layer, and the silicon nitride gate dielectric layer so that a portion of the amorphous silicon layer is exposed; and
depositing a mesa passivation layer over the silicon nitride intermetal dielectric layer, the amorphous silicon layer, and the silicon nitride gate dielectric layer so that the mesa passivation layer covers the portion of the amorphous silicon layer.

5. The method of claim 1, wherein:
the diffusion barrier comprises tantalum; and
the one or more contact elements further comprises a metal layer and N+ amorphous silicon layer.

6. The method of claim 5, wherein:
depositing one or more contact elements comprises depositing the diffusion barrier between the metal layer and the N+ amorphous silicon layer.

7. The method of claim 6, further comprising:
before decoupling the flexible substrate from the carrier substrate;
etching the one or more contact elements, wherein the one or more contact elements are etched in a single process.

8. The method of claim 1, wherein:
depositing one or more one silicon comprising layers comprises using plasma-enhanced chemical vapor deposition.

9. The method of claim 1, wherein:
the temperature of the depositing the one or more silicon comprising layers reaches at least 188° C.

10. The method of claim 1, wherein:
depositing the one or more silicon comprising layers over the gate metal layer occurs at near vacuum pressure.

11. The method of claim 1, wherein:
the flexible substrate comprises polyethylene naphthalate.

12. The method of claim 1, further comprising:
depositing a base dielectric material over the one or more contact elements before depositing the first dielectric material over the one or more contact elements, wherein the base dielectric material comprises silicon oxide.

13. The method of claim 1, further comprising:
before depositing the gate metal layer over the flexible substrate and after coupling the carrier substrate to the flexible substrate, detaching the protective material from the flexible substrate and decoupling the protective template from the flexible substrate.

14. A method of providing a semiconductor device, the method comprising:
providing a carrier substrate;
providing a flexible substrate, wherein the flexible substrate is planarized;
providing a protective template;
attaching a protective material to the flexible substrate;
coupling the protective template to the flexible substrate such that the protective material is at least partially located between the protective template and the flexible substrate;
after coupling the protective template to the flexible substrate, coupling the carrier substrate to the flexible substrate with an adhesive having a bonding force, wherein coupling the carrier substrate to the flexible substrate comprises:
spin-coating the adhesive over the flexible substrate; and
laminating the carrier substrate and the flexible substrate with the adhesive located between the carrier substrate and the flexible substrate;
after coupling the carrier substrate to the flexible substrate, depositing a gate metal layer over the flexible substrate;
depositing one or more silicon comprising layers over the gate metal layer, wherein a temperature of the depositing the one or more silicon comprising layers reaches at least 180° C.;
depositing one or more contact elements over the one or more silicon comprising layers, wherein the one or more contact elements comprises a diffusion barrier;
depositing a first dielectric material over the one or more contact elements, wherein the first dielectric material comprises an organic siloxane-based dielectric material;

depositing a second dielectric material over the first dielectric material, wherein the second dielectric material comprises silicon nitride;

baking the first dielectric material, the second dielectric material, the flexible substrate, the carrier substrate, the gate metal layer, the one or more silicon comprising layers, and the one or more contact elements, wherein the temperature of the baking reaches at least 200° C.; and after the baking and while the adhesive is bonding the carrier substrate to the flexible substrate with the bonding force, decoupling the flexible substrate from the carrier substrate, wherein the decoupling consists of peeling the flexible substrate from the carrier substrate.

15. The method of claim 14, wherein:
the one or more silicon comprising layers comprises an amorphous silicon layer.

16. The method of claim 15, wherein:
the one or more silicon comprising layers further comprises a silicon nitride gate dielectric layer and a silicon nitride intermetal dielectric layer.

17. The method of claim 16, further comprising:
before decoupling the flexible substrate from the carrier substrate:

etching the silicon nitride intermetal dielectric layer, the amorphous silicon layer, and the silicon nitride gate dielectric layer so that a portion of the amorphous silicon layer is exposed; and depositing a mesa passivation layer over the silicon nitride intermetal dielectric layer, the amorphous silicon layer, and the silicon nitride gate dielectric layer so that the mesa passivation layer covers the portion of the amorphous silicon layer.

18. The method of claim 14, wherein:
the diffusion barrier comprises tantalum; and
the one or more contact elements further comprises a metal layer and an N+ amorphous silicon layer.

19. The method of claim 18, wherein:
depositing the one or more contact elements comprises depositing the diffusion barrier between the metal layer and the N+ amorphous silicon layer.

20. The method of claim 14, further comprising:
before decoupling the flexible substrate from the carrier substrate;
etching the one or more contact elements, wherein the one or more contact elements are etched in a single process.

* * * * *